(12) United States Patent
Hirano et al.

(10) Patent No.: US 6,449,183 B1
(45) Date of Patent: Sep. 10, 2002

(54) FERROELECTRIC MEMORY SYSTEM AND METHOD OF DRIVING THE SAME

(75) Inventors: Hiroshige Hirano, Nara; Masato Takeo, Kyoto, both of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/717,254

(22) Filed: Nov. 22, 2000

Related U.S. Application Data

(62) Division of application No. 09/147,598, filed as application No. PCT/JP98/02883 on Jun. 26, 1998, now Pat. No. 6,157,563.

(30) Foreign Application Priority Data

Jun. 27, 1997  (JP) ............................................. 9-171393

(51) Int. Cl.[7] .............................................. G11C 11/22
(52) U.S. Cl. .................. 365/145; 365/149; 365/189.09; 365/211
(58) Field of Search ................................. 365/145, 149, 365/189.09, 211

(56) References Cited

U.S. PATENT DOCUMENTS

| | | | |
|---|---|---|---|
| 4,873,664 A | 10/1989 | Eaton, Jr. | |
| 4,888,773 A | 12/1989 | Arlington et al. | |
| 5,262,982 A | 11/1993 | Brassington et al. | |
| 5,532,953 A | 7/1996 | Ruesch et al. | |
| 5,539,279 A | 7/1996 | Takeuchi et al. | |
| 5,600,587 A | 2/1997 | Koike | |
| 5,699,075 A | * 12/1997 | Miyamoto | 345/97 |
| 5,764,561 A | 6/1998 | Nishimura | |
| 5,798,964 A | 8/1998 | Shimizu et al. | |
| 5,835,400 A | * 11/1998 | Jeon et al. | 365/145 |
| 5,956,266 A | * 9/1999 | Wilson et al. | 365/145 |
| 6,028,783 A | * 2/2000 | Allen et al. | 365/145 |
| 6,118,688 A | * 9/2000 | Hirano et al. | 365/145 |

FOREIGN PATENT DOCUMENTS

| | | |
|---|---|---|
| JP | 05-198194 | 8/1993 |
| JP | 08-147983 | 7/1996 |
| JP | 08-273375 | 10/1996 |

\* cited by examiner

*Primary Examiner*—David Nelms
*Assistant Examiner*—Gene N. Auduong
(74) *Attorney, Agent, or Firm*—Nixon Peabody LLP; Donald R. Studebaker

(57) ABSTRACT

Under application of a voltage V3 to a cell plate line PC, a voltage difference appearing on a bit line BL and an inverted bit line /BL in accordance with a polarized state of a memory cell capacitor and a line capacitance is amplified by a sense amplifier, thereby reading data. A read time for this read operation is tR, which is substantially the same as a write time tWL of L data and a write time tWH of H data. Also, the same voltage is used in a write operation and a read operation. Specifically, the operations are conducted with a write energy larger than a read energy. As a result, a read error can be avoided. Furthermore, since an energy not saturating polarization of a ferroelectric film is used in a write operation, there is no need to provide a voltage increasing circuit, and a high operation can be realized.

10 Claims, 16 Drawing Sheets

FERROELECTRIC MEMORY SYSTEM AND METHOD OF DRIVING THE SAME

This application is a Divisional of application Ser. No. 09/147,598, filed Jan. 29, 1999 which based on, PCT/JP98/02883 filed Jun. 26, 1998 now U.S. Pat. No. 6,157,563.

TECHNICAL FILED

The present invention relates to a memory system included in electronic equipment, in particular, a ferroelectric-memory system including a memory cell provided with a ferroelectric capacitor.

BACKGROUND ART

Recently, a ferroelectric memory system is proposed in which a capacitance film of a ferroelectric material is disposed in a capacitor of a memory cell so as to make stored data nonvolatile. A ferroelectric material is a material having a characteristic of polarization changed in accordance with a change in the polarity of a voltage (an electric field) in a hysteresis loop as is shown in FIG. 20. Specifically, in a ferroelectric material, as an applied voltage (electric field) is increased, the polarization is increased along a change curve and reaches a saturation polarization value at a point A, and as the voltage (electric field) is decreased, the polarization is gradually decreased not through the above-described change process, and even when the electric field becomes 0, the polarization does not become 0 but residual polarization at a point B remains. When a negative electric field is applied to a ferroelectric material and the electric field is increased in the negative direction, a saturation polarization value is attained at a point C, and when the electric field is decreased to 0, residual polarization at a point D remains. In this manner, a ferroelectric material has a characteristic that residual polarization remains in accordance with the strength and the polarity of an electric field applied theretofore, namely, the so-called hysteresis characteristic. At this point, a saturation polarization value corresponds to a point where the two change curves in the hysteresis curve of FIG. 20 become substantially the same curve, namely, a point where these curves are substantially in contact with each other. Furthermore, the behavior of polarization inversion depends not upon a voltage but upon an electric field given as a value obtained by dividing a voltage by a film thickness, but in the following description, the thickness of a ferroelectric film is fixed, and hence, an operation characteristic in accordance with a voltage will be described.

Therefore, when a ferroelectric capacitor including a ferroelectric film sandwiched between two conductive films is provided in a memory cell and residual polarization of the ferroelectric film in accordance with the polarity and the amplitude of a signal voltage is used as stored data, the stored data can be nonvolatile, and thus, the so-called nonvolatile memory system can be realized.

For example, U.S. Pat. No. 4,873,664 discloses the following two types of ferroelectric memory systems:

In the first type of the nonvolatile memory system, a memory cell includes one transistor and one ferroelectric capacitor (1T1C) per bit. In this case, one dummy memory cell (reference cell) is provided to, for example, every 256 main memory cells (normal cells).

In the second type of the nonvolatile memory system, no dummy memory cell is provided and a memory cell includes two transistors and two ferroelectric capacitors (2T2C) per bit. In this case, a pair of complementary data are stored in a pair of ferroelectric capacitors.

Furthermore, as is disclosed in, for example, U.S. Pat. No. 4,888,733, a memory cell can include two transistors and one ferroelectric capacitor (2T1C) per bit.

Moreover, as a ferroelectric material used in a ferroelectric capacitor, $KNO_3$, $PbLa_2O_3$—$ZrO_2$—$TiO_2$, $PbTiO_3$—$PbZrO_3$ and the like are known. Furthermore, PCT International Publication No. WO93/12542 discloses a ferroelectric material suitable to a ferroelectric capacitor used in a ferroelectric memory system that is much less fatigued than $PbTiO_3$—$PbZrO_3$.

On the other hand, ferroelectric materials generally used at present cannot be free from fatigue, and when they are used for a long period of time, their ability to store data can be spoiled.

Therefore, as is disclosed in U.S. Pat. No. 5,532,953, in order not to spoil the ability to store data through usage for a long period of time, a technique to write data at a voltage sufficient for completely saturating a ferroelectric capacitor is used.

Now, the structure and the operation of a ferroelectric memory system disclosed in this publication will be described.

FIG. 21 is an electric circuit diagram for showing the configuration of a memory cell portion of the conventional ferroelectric memory system. In FIG. 21, between a bit line 124 and an inverted bit line 126 and a cell plate line 122 in a memory cell 110, memory cell transistors 112 and 114 and memory cell capacitors 116 and 118 are serially disposed. The gates of the memory cell transistors 112 and 114 are connected with a word line 120. Furthermore, for example, with one of the memory cell capacitors supplied with the residual polarization at the point B (H data) of FIG. 20, and with the other memory cell capacitor supplied with the residual polarization at the point D (L data) of FIG. 20, the polarized state of these two memory capacitors is regarded as data "1". Also, with each of the memory cell capacitors placed in the opposite polarized state to the polarized state of data "1", this opposite polarized state is stored as data "0". By utilizing such complementary data, a ferroelectric memory system with high reliability can be obtained.

Next, read, write (including rewrite) and recovery operations of the conventional ferroelectric memory system will be described. FIGS. 22(a) and 22(b) are flowcharts described in the aforementioned publication as FIGS. 4A and 4B. As is shown in FIG. 22(a), at times t3 and t4, data is read by releasing the charges of the memory cell capacitors 112 and 114 onto the bit line 124 and the inverted bit line 126, and at a time t5, a voltage difference between the bit line 124 and the inverted bit line 126 is sensed through amplification to logical values H and L. Next, at a time t6, a charge pump is operated so as to increase the supply voltage from 4 V to 6 V. Then, by utilizing the increased supply voltage, a write operation is conducted at the time t6. Through the aforementioned procedures, read, sense and write operations are conducted.

Also, as is shown in FIG. 22(b), read, sense and recovery operations are conducted through similar procedures. A recovery operation is an operation for returning the polarized state of a ferroelectric capacitor to a state prior to a read operation.

At this point, the aforementioned publication describes that a write pulse and a release pulse have a width of 20 nanoseconds, and that a read pulse has substantially the same width.

In this manner, in the above-described conventional ferroelectric memory system, a write operation is conducted under application of a voltage necessary for completely saturating a capacitor of a ferroelectric capacitor (the point A of FIG. 20). Specifically, a write operation is conducted at the high voltage (6 V) increased by the charge pump. By adopting such a writing method, the data holding performance of the ferroelectric memory system is to be improved and the life is to be elongated.

PROBLEMS TO BE SOLVED

However, in the conventional ferroelectric memory system, a write operation is conducted at a higher voltage than a normal voltage so as to completely saturate the ferroelectric capacitor as described above. Accordingly, in order to supply the increased voltage to, for example, a cell plate line PL and a sense amplifier, it is necessary to provide an internal voltage increasing circuit of a charge pump circuit. Since the charge pump circuit is thus provided, there are disadvantages that the entire layout area is increased by the area of circuit elements, such as a capacitor, necessary for the charge pump circuit and that the circuit is complicated. In addition, in accordance with experiment data described below obtained by the present inventors, a write operation conducted so as to completely saturate the polarized state of the ferroelectric capacitor can lead to a disadvantage in a field requiring a high speed operation. Furthermore, an endurance (rewrite) operation, namely, a polarization inverting operation, repeatedly conducted with the polarization completely saturated results in a hysteresis characteristic where the residual polarization decreases. Specifically, it has been found that the ability of holding data can be spoiled.

As the most significant problem, in some usage, a ferroelectric memory system is required to be operated in a wide voltage range of 2 through 6 V, and in such a case, it is difficult to always conduct a write operation at a high voltage sufficient for saturating the polarization.

Moreover, when an operation in a wide voltage range is required, a rewrite operation conducted at a low voltage of approximately 2 V can lead to a read error. In such a case, no examination is made on the mechanism for causing a read error and a method of effectively preventing a read error in any of the ferroelectric memory system of the aforementioned publication and the other conventional ferroelectric memory systems.

DISCLOSURE OF INVENTION

A first object of the invention is tracing the cause of a read error and providing means for eliminating the cause, thereby providing a highly reliable ferroelectric memory system and a method of driving the same.

A second object of the invention is providing a ferroelectric memory system capable of a high speed operation without providing an additional circuit such as a charge pump circuit and a method of driving the same.

First, the viewpoint and the fundamental principle of the present invention for achieving the aforementioned objects will be described. As described above, the conventional writing method can lead to a disadvantage in a high speed operation and a phenomenon of a read error which cannot be overcome by the writing method is caused. As a result of tracing the cause of such a read error, it has been found that providing means for overcoming the cause is largely related to solving the problem of the conventional writing method.

First, the present inventors have found that polarization inversion has time dependency so that the polarization inversion can be proceeded with time. Specifically, in the conventional writing method, it has not been noticed that the polarization inverted state of a ferroelectric capacitor depends upon the pulse width (time duration) of a write voltage signal. FIG. 7 is a diagram resulting from examination on variation of the polarization inversion in accordance with the pulse width of a voltage signal in a write and rewrite operation. As is shown in this diagram, the polarization inversion Pnv is largely varied depending upon the width (time duration) of an applied pulse. FIG. 7 will be described in detail below.

Secondly, it has been also found that this time dependency of the polarization inversion Pnv remarkably appears in a region where a voltage applied to a ferroelectric capacitor is low.

Thirdly, it has been also found that the polarization inversion is difficult to proceed at a low temperature. FIG. 8 is a diagram resulting from examination on variation of the polarization inversion Pnv in accordance with the pulse width obtained through a similar experiment to that of FIG. 7 conducted with a pulse voltage fixed to 3 V by using a temperature as a parameter. As is shown in this diagram, it is understood that the polarization inversion is more difficult to proceed at a lower temperature. This implies that, in a ferroelectric capacitor film of polycrystal, domains in the polycrystal include those difficult to polarize and those easy to polarize.

Specifically, the following has been found: Since a ferroelectric capacitor is operated in accordance with such a hysteresis characteristic, there is no need to apply a voltage until the polarized state of a ferroelectric film is completely saturated in writing data in the ferroelectric capacitor, but the memory operation can be easily conducted by adopting an applied voltage or a voltage application time with which a read operation is accurately conducted.

Moreover, as described below, the present inventors have found that the proceeding of the polarization inversion for a write operation can be determined on the basis of an energy to be supplied to a ferroelectric capacitor, namely, a write energy including factors of an applied voltage and a voltage application time, and that the proceeding of the polarization inversion for a read operation can be similarly determined on the basis of a read energy including factors of an applied voltage and a voltage application time.

The present invention achieved through the aforementioned process has the following contents:

The first ferroelectric memory system of this invention comprises a bit line; a cell plate line; a ferroelectric capacitor including a ferroelectric film and disposed between the bit line and the cell plate line; a memory cell transistor disposed between the bit line and the ferroelectric capacitor; writing means for supplying a first energy for polarizing the ferroelectric film to the ferroelectric capacitor through the cell plate line and the bit line; and reading means for supplying a second energy for reading a polarized state of the ferroelectric film to the ferroelectric capacitor through the cell plate line and the bit line, wherein the second energy is smaller than the first energy.

In this manner, a ferroelectric memory system capable of a normal operation without increasing a voltage and a write pulse width (time duration) than necessary can be realized. Specifically, polarization inversion sufficient for a read operation can be conducted without always completely saturating polarization of a ferroelectric capacitor in a write operation. Furthermore, polarization inversion sufficient for a read operation is conducted by elongating a write pulse width (time duration) without increasing a voltage used in a write operation, and thus, a ferroelectric memory system capable of efficient write and read operations can be realized.

In the first ferroelectric memory system, a voltage applied in a write operation can be lower than a saturation voltage for completely saturating polarization of the ferroelectric film, and a voltage value used in a read operation can be made small.

In the ferroelectric memory system thus operated, since there is no need to invert polarization until the complete saturation in a write operation, the write operation can be conducted at a low voltage and a high speed and the polarization is not completely saturated, and therefore, an operation with small power consumption can be attained. Furthermore, since there is no need to provide a charge pump circuit (voltage increasing circuit) for a write operation, the operation with small power consumption can be attained. Moreover, an endurance (rewrite) operation, namely, a polarization inversion operation, repeatedly conducted with the polarization completely saturated results in a hysteresis characteristic in which residual polarization is decreased. Specifically, an ability to hold data can be spoiled. In contrast, when a write operation is conducted without saturating polarization, the ability to hold data can be scarcely spoiled through an endurance (rewrite) operation.

In the first ferroelectric memory system, a read time (pulse width) can be shorter than a write time.

As a result, a ferroelectric memory system with high reading accuracy and high operation speed can be realized.

The second ferroelectric memory system of this invention comprises first and second bit lines; a cell plate line; a first ferroelectric capacitor including a ferroelectric film and disposed between the first bit line and the cell plate line; a second ferroelectric capacitor including a ferroelectric film and disposed between the second bit line and the cell plate line; first and second memory cell transistors respectively disposed between the first and second bit lines and the first and second ferroelectric capacitors; and writing/rewriting control means for conducting a write operation in the ferroelectric film of the first ferroelectric capacitor with a first energy for attaining a first polarized state and subsequently conducting a rewrite operation with a second energy for attaining a second polarized state that is obtained by changing the first polarized state in a direction where a polarity is to be changed, while conducting a write operation in the ferroelectric film of the second ferroelectric capacitor with the first energy for attaining a third polarized state and subsequently conducting a rewrite operation with the second energy for attaining a fourth polarized state that is obtained by changing the third polarized state in a direction where a polarity is to be changed, wherein the first energy and the second energy are supplied in a manner that the first polarized state has an opposite polarity to the second polarized state.

It has been found that a read error can be avoided in this manner even when a read operation is conducted with an energy substantially the same as an energy used in a write operation.

The third ferroelectric memory system of this invention comprises first and second bit lines; a cell plate line; a first ferroelectric capacitor including a ferroelectric film and disposed between the first bit line and the cell plate line; a second ferroelectric capacitor including a ferroelectric film and disposed between the second bit line and the cell plate line; first and second memory cell transistors respectively disposed between the first and second bit lines and the first and second ferroelectric capacitors; writing/rewriting control means for conducting a write operation in the ferroelectric film of the first ferroelectric capacitor with a first energy for attaining a first polarized state and subsequently conducting a rewrite operation with a second energy for attaining a second polarized state that is obtained by changing the first polarized state in a direction where a polarity is to be changed, while conducting a write operation in the ferroelectric film of the second ferroelectric capacitor with the first energy for attaining a third polarized state and subsequently conducting a rewrite operation with the second energy for attaining a fourth polarized state that is obtained by changing the third polarized state in a direction where a polarity is to be changed; and reading control means for conducting a read operation by supplying a third energy to the ferroelectric films of the first and second ferroelectric capacitors through the cell plate line, wherein the third energy is smaller than the second energy.

In this manner, a read error can be prevented in a ferroelectric memory system having a 2T2C memory cell structure.

The fourth ferroelectric memory system of this invention comprises a bit line; a cell plate line; a ferroelectric capacitor including a ferroelectric film and disposed between the bit line and the cell plate line; a memory cell transistor disposed between the bit line and the ferroelectric capacitor; and a writing control circuit for supplying a first energy for polarizing the ferroelectric film of the ferroelectric capacitor between the cell plate line and the bit line, wherein the writing control circuit controls the first energy in a manner that the ferroelectric film is placed in substantially the same polarized state against a temperature change.

In this manner, the polarization inversion of the ferroelectric capacitor can be sufficiently conducted without increasing a write voltage by using a voltage increasing circuit or the like but by sufficiently elongating a write pulse width (time duration), so that a ferroelectric memory system capable of a normal operation at a low voltage can be realized. Furthermore, as a result, a high speed operation can be retained as far as possible even at a low temperature.

The fourth ferroelectric memory system can further comprise reading control means for supplying a second energy for reading a polarized state of the ferroelectric film, and the second energy can be smaller than the first energy.

In the fourth ferroelectric memory system, the writing control circuit can control to conduct a write operation at a higher voltage when a temperature is lower, or the writing control circuit can supply a write signal with a larger pulse width as a temperature is lower.

In the fourth ferroelectric memory system, the writing control circuit can include an internal voltage generation circuit for generating an internal voltage signal that has a lower voltage as a temperature is lower; and a circuit for receiving the internal voltage signal generated by the internal pulse signal generation circuit and generating a pulse signal having a larger pulse width as the voltage of the internal voltage signal is lower.

The first method of this invention of driving a ferroelectric memory system including a ferroelectric capacitor provided with a ferroelectric film and disposed between a bit line and the cell plate line and a memory cell transistor disposed between the bit line and the ferroelectric capacitor, comprises a first step of supplying the ferroelectric capacitor with a first energy for polarizing the ferroelectric film in an unsaturated state; and a second step of supplying the ferroelectric capacitor with a second energy for reading a polarized state of the ferroelectric film, wherein the second energy is smaller than the first energy.

In the first method of driving a ferroelectric memory system, a first pulse signal having a predetermined pulse width can be supplied in the first step, and a second pulse signal having a pulse width smaller than the predetermined pulse width can be supplied in the second step.

The second method of this invention of driving a ferroelectric memory system including first and second ferroelectric capacitors respectively provided with ferroelectric films and disposed between first and second bit lines and a cell plate line, and first and second memory cell transistors respectively disposed between the first and second bit lines and the first and second ferroelectric capacitors, comprises a first step of conducing a write operation in the ferroelectric film of the first ferroelectric capacitor with a first energy for attaining a first polarized state and subsequently conducting a rewrite operation with a second energy for attaining a second polarized state that is obtained by changing the first polarized state in a direction toward an opposite polarity, while conducting a write operation in the ferroelectric film of the second ferroelectric capacitor with the first energy for attaining a third polarized state and subsequently conducting a rewrite operation with the second energy for attaining a fourth polarized state that is obtained by changing the third polarized state in a direction toward an opposite polarity; and a second step of conducting a read operation by supplying a third energy to the ferroelectric films of the first and second ferroelectric capacitors through the cell plate line, wherein the first energy and the second energy are supplied in a manner that the second polarized state has an opposite polarity to the first polarized state.

BEST MODE FOR CARRYING OUT THE INVENTION

Before describing a ferroelectric memory system according to an embodiment of the invention, the operation characteristic found as a result of large number of experiments conducted in the process for achieving the invention will be described.

Figure 1:
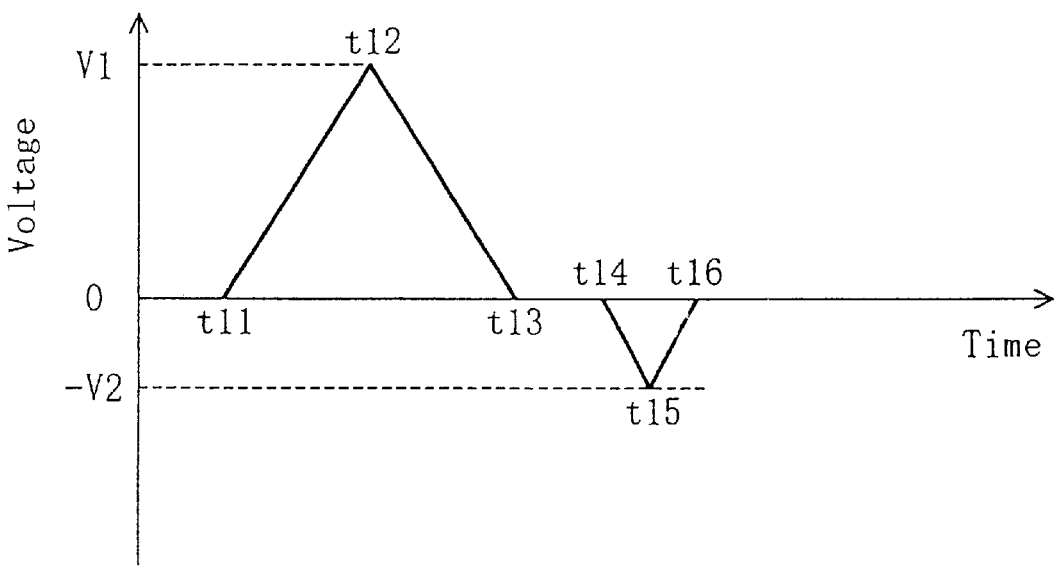
FIG. 1 is a diagram for showing a first voltage application method for a ferroelectric capacitor conducted for examining an effect of a voltage application time in a rewrite operation in the process for achieving the invention.
Figure 2:
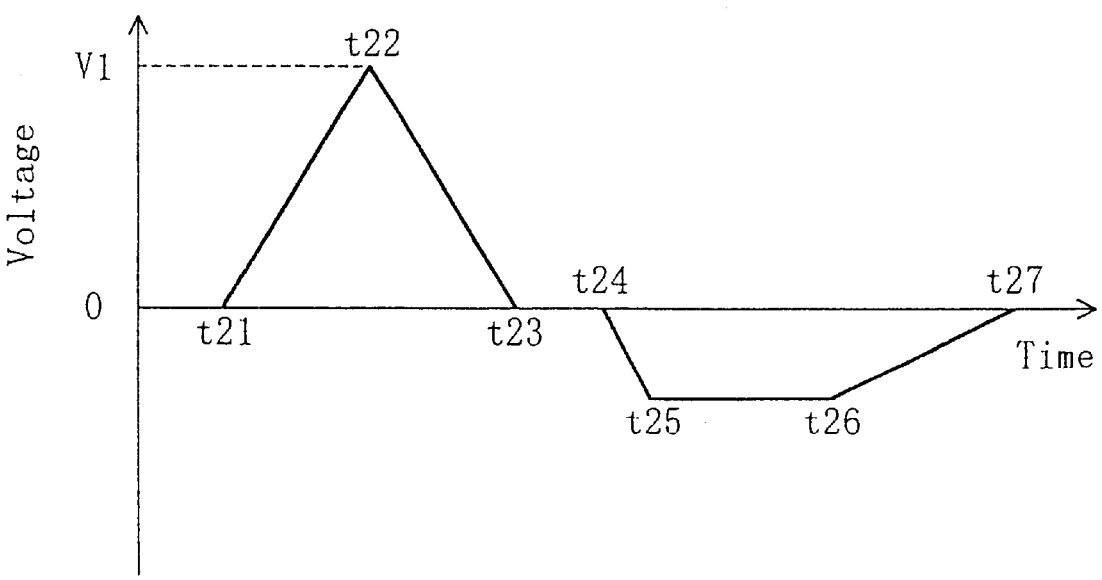
FIG. 2 is a diagram for showing a second voltage application method for a ferroelectric capacitor conducted for examining an effect of a voltage application time in a rewrite operation in the process for achieving the invention.

FIGS. 1 and 2 are diagrams of application methods of a rewrite voltage to a ferroelectric capacitor used in experiments conducted for examining an effect of a voltage application time in a write operation of a ferroelectric memory system. In FIGS. 1 and 2, the abscissa indicates a time and the ordinate indicates a value of the applied voltage.

In the application method shown in FIG. 1, a positive voltage linearly increasing is applied from a time t11 to a time t12, and when the applied voltage reaches the maximum value V1 at the time t12, a positive voltage linearly decreasing is applied from the time t12 to a time t13, so that the applied voltage can become 0 at the time t13. In the time duration from the time t11 to the time t13, H data is written in the ferroelectric capacitor. Thereafter, the voltage is retained at 0 until a time t14, a negative voltage with an absolute value linearly increasing is applied from the time t14 to a time t15, and when the applied voltage reaches the minimum value −V2 at the time t15, a negative voltage with an absolute value linearly decreasing is applied from the time t15 to a time t16, so that the applied voltage can become 0 at the time t16. At this point, the absolute value of the minimum voltage −V2 is assumed to be smaller than the absolute value of the maximum voltage V1. During the time duration from the time t14 to the time t16, L data is written in the ferroelectric capacitor.

In the application method shown in FIG. 2, a voltage varied in the same manner as that between the time t11 and the time t13 in FIG. 1 is applied from a time t21 to a time t22, during which H data is written in the ferroelectric capacitor.

Thereafter, the voltage is retained at 0 until a time t24, a negative voltage with an absolute value linearly increasing is applied from the time t24 to a time t25, and when the applied voltage reaches the minimum value −V2 at the time t25, the applied voltage is retained at the minimum value −V2 from the time t25 to a time t26. Then, a negative voltage with an absolute value linearly decreasing is applied from the time t26 to a time t27, so that the applied voltage can become 0 at the time t27. Specifically, the voltage application method shown in FIG. 2 is different from the voltage application method shown in FIG. 1 in retaining the negative voltage for a predetermined time period in an L data write operation.

Figure 3:
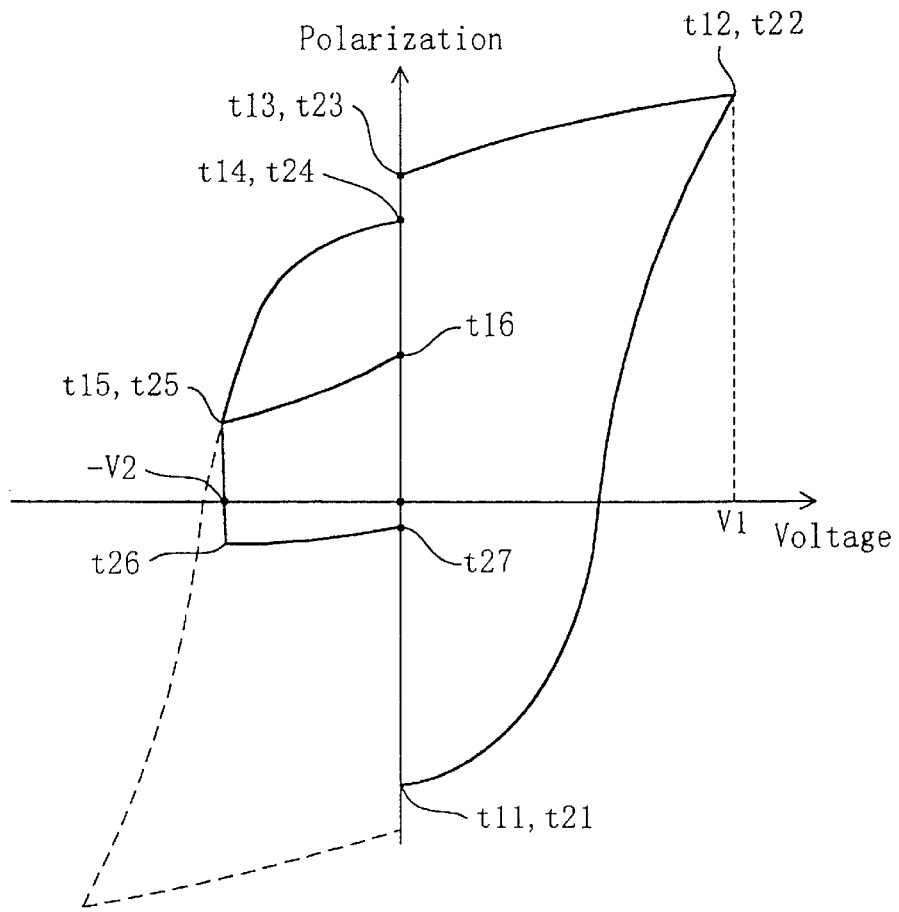
FIG. 3 is a hysteresis characteristic diagram for comparing differences in polarized states of the ferroelectric capacitors caused by the rewrite voltage application methods of FIGS. 1 and 2.

FIG. 3 is a diagram for showing a hysteresis characteristic of a ferroelectric capacitor obtained by applying a voltage to the ferroelectric capacitor by the methods shown in FIGS. 1 and 2. In FIG. 3, points shown with t11 through t16 indicate polarized states attained when the voltage is applied to the ferroelectric capacitor by the method of FIG. 1. As is understood from FIG. 3, the absolute value of the voltage −V2 applied in the negative direction to the ferroelectric capacitor is smaller than the absolute value of the voltage V1 applied in the positive direction, and the voltage is set so that the polarization of the ferroelectric capacitor cannot be smaller than 0 but a positive polarized state can be attained. Also, since the applied voltage is 0 from the point corresponding to the time t13 to the point corresponding to the time t14, decrease (relaxation) of the polarization of the ferroelectric capacitor can be observed.

Next, when the voltage is applied to the ferroelectric capacitor by the method shown in FIG. 2, as is shown in FIG. 3, the polarized state of the ferroelectric capacitor between the times t21 and t25 is the same as the polarized state between the times t11 and t15 shown in FIG. 1. However, since the negative voltage −V2 is applied to the ferroelectric capacitor for a predetermined time period between the times t25 and t26, the polarized state of the ferroelectric capacitor shown in FIG. 3 is found to change in the direction of the applied voltage (the negative direction) between the times t25 and t26. In other words, the polarized state of the ferroelectric capacitor is found to be changed depending upon not only the amplitude of the applied voltage but also the application time. Specifically, comprehensive consideration of the amplitude and time of an applied voltage, that is, the so-called write energy, is found to be related to a change of the polarization. Specifically, the hysteresis characteristic curve shown in FIG. 3 indicates the polarized states attained by applying a voltage with a specific change characteristic as is shown in FIG. 1 or the like, and different polarized states can be obtained by changing the application time of the voltage, namely, the frequency of the applied voltage. Accordingly, it is found to be significant to set timing of an actual device with a hysteresis characteristic according to the operation timing of the device.

Next, an experiment carried out on the relationship between the polarized state of a ferroelectric capacitor and a read error will be described.

Figure 4:
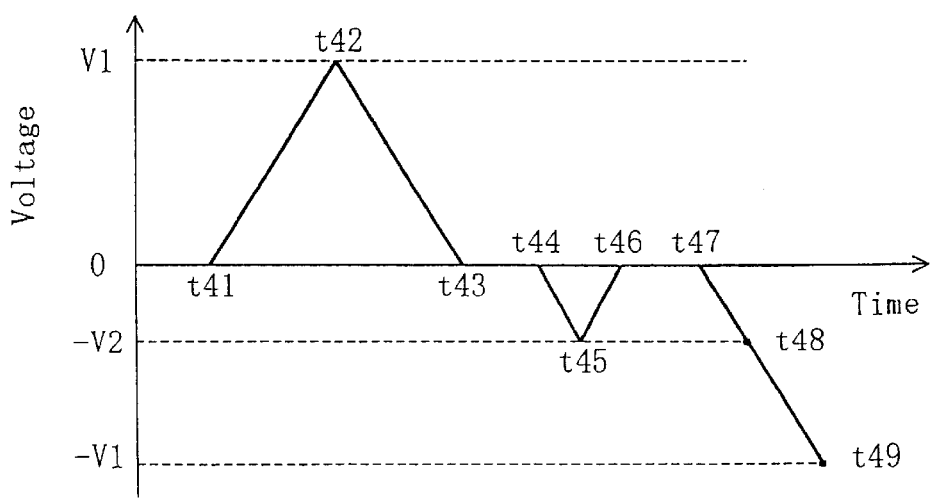
FIG. 4 is a diagram for showing a voltage application method for one ferroelectric capacitor conducted for examining an effect of an applied voltage in a read operation in the process for achieving the invention.
Figure 5:
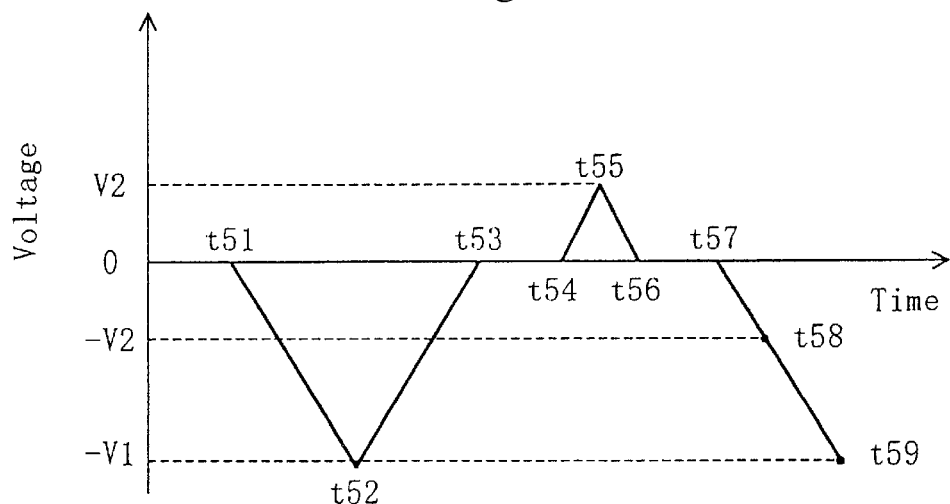
FIG. 5 is a diagram for showing a voltage application method for another ferroelectric capacitor conducted for examining an effect of an applied voltage in a read operation in the process for achieving the invention.

FIGS. 4 and 5 are diagrams for showing application methods of a voltage applied to a pair of ferroelectric capacitors in the experiment carried out for examining the relationship between a write and read operation and a read error of a ferroelectric memory system. In FIGS. 4 and 5, the abscissa indicates a time and the ordinate indicates a value of the applied voltage. FIG. 4 shows the application of a voltage possibly occurring in writing data in, rewriting data in (inverting data in) and reading data from one of the pair of ferroelectric capacitors, in which the polarity of a voltage at a cell plate line in writing first data at a high voltage V1 is opposite to the polarity of a voltage at the cell plate line in a rewrite and read operation. On the other hand, FIG. 5 shows the application of a voltage for writing data in, rewriting data in (inverting data in) and reading data from the other of the pair of ferroelectric capacitors, in which the polarity of a voltage at a cell plate line in writing first data at a voltage −V1 with a large absolute value is opposite to the polarity of a voltage at the cell plate line in a rewrite operation, and the polarity of a voltage at the cell plate line in writing first data accords with the polarity of a voltage at the cell plate line in a read operation.

It is assumed that, in the write, rewrite and read operation shown in FIG. 4, from a time t41 to a time t46, a voltage is applied by the method adopted from the time t11 to the time t16 of FIG. 1, during which data is written and rewritten in one of the ferroelectric capacitors. Next, in a read operation, from the time t46 to a time t47, the applied voltage is retained at 0, and from the time t47 to a time t49, a negative voltage with an absolute value linearly increasing is applied. At this point, it is assumed that the voltage −V2 the same as the voltage used in the rewrite operation is applied at a time t48, and that a voltage −V1 is applied at the time t49.

Figure 6:
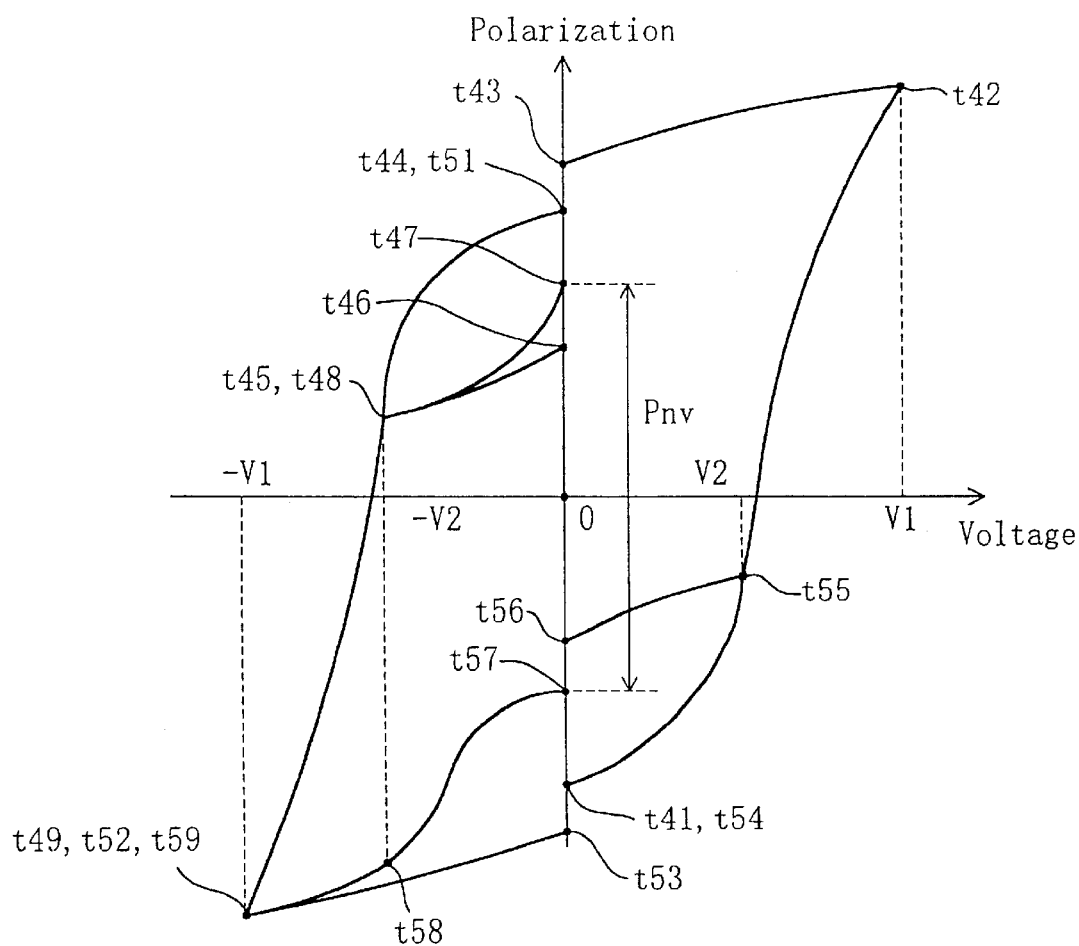
FIG. 6 is a hysteresis characteristic diagram for showing polarized states of the ferroelectric capacitors caused by the read voltage application methods of FIGS. 4 and 5.

In this case, in a hysteresis characteristic diagram of FIG. 6, H data is written in one of the ferroelectric capacitors so that the polarization can be changed from that of the time t41 and pass through that of the time t42, and the polarized state at the time t43 can be attained. However, due to the relaxation, the ferroelectric capacitor in which the data has been written ultimately attains the polarized state of the time t44. Also, the data is rewritten (L data) in this ferroelectric capacitor so that the polarization can be changed from that of the time t44, pass through that of the time t45, and the polarized state of the point 46 can be attained. However, due to the relaxation, the ferroelectric capacitor in which the data has been rewritten ultimately attains the polarized state of the time t47. This relaxation phenomenon seems to be caused because, when the applied voltage to the ferroelectric capacitor is varied in a decreasing direction (0 in this case), among domains of the ferroelectric film consisting of polycrystal, those with easily changeable polarized states return to the polarization in the initial direction. Next, from the time t47 to the time t48, corresponding to a data read operation, the polarized state of this one ferroelectric capacitor is changed at the time t48 so as to substantially accord with the polarized state at the time t45 as is shown in FIG. 6. Thereafter, when the voltage −V1 is applied to the ferroelectric capacitor as, for example, a read operation, the polarized state of this ferroelectric capacitor is changed from the time t48 to the time t49. Then, since a voltage corresponding to the polarized state at the time t49 appears on a bit line, the data is read.

On the other hand, it is assumed that, in the write, rewrite and read operation shown in FIG. 5, between a time t51 and a time t56, a voltage with an opposite polarity to that of the method adopted from the time t41 to the time t46 of FIG. 4 is applied, so as to write and rewrite data in the other ferroelectric capacitor. Next, in a read operation, from the time t56 to a time t57, a voltage with the same polarity as that of the method of FIG. 4 is applied to this ferroelectric capacitor.

In this case, in the hysteresis characteristic diagram of FIG. 6, L data is written in one of the ferroelectric capacitors, so that the polarization can be changed from a point of the time t51 and pass through a point of the time t52, and the polarized state at a point of the time t53 can be attained. However, due to the relaxation, the ferroelectric capacitor in which data has been written ultimately attains the polarized state at a point of the time t54. Also, data is rewritten (H data) in this ferroelectric capacitor so that the polarization can be changed from a point of the time t54 and pass through a point of the time t55, and the polarized state at a point of the time t56 can be attained. However, due to the relaxation, the ferroelectric capacitor in which the data has been rewritten ultimately attains the polarized state at a point of the time t57.

At this point, a difference of polarization Pnv is caused between the polarization of one ferroelectric capacitor attained after the inversion and the polarization of the other ferroelectric capacitor attained after the inversion, and this polarization Pnv is a negative value because it has the opposite polarity to that of polarization originally to be inverted to.

Next, between points of the time t57 and a time t59, corresponding to a data read operation, the polarization is changed similarly to the change curve between the point of the time t52 and the point of the time t53 because those with easily changeable polarized states are mainly changed in a negative polarization direction at a point of a time t58. Next, at the time t59, the polarization is changed to be close to the point of the time t52. Then, since a voltage corresponding to the polarized state at the point of the time t59 appears on a bit line, the data is read.

However, in the read operation at the points of the times t49 and t59 (actually the same time), when a change between the points of the times t47 and t49 of the polarization of the ferroelectric capacitor where the L data has been rewritten is compared with a change between the points of the times 57 and t59 of the polarization of the ferroelectric capacitor where the H data has been rewritten, that of the ferroelectric capacitor where the L data has been written is larger. Specifically, a charge amount read from the ferroelectric capacitor is larger in the ferroelectric capacitor where the L data has been written, and hence, in this read operation, the read data is opposite to right data. For example, data that should be read as "1" is read as "0" in error. This is because the polarization difference Pnv has a negative value, and when the polarization difference Pnv has a positive value, the reversal in the size of the polarization change between the H rewritten data and the L rewritten data is not caused.

On the other hand, at the points of the times t48 and t58, when a change between the points of the times t47 and t48 of the polarization of the ferroelectric capacitor where the L data has been rewritten is compared with a change between the points of the times t57 and t58 of the polarization of the ferroelectric capacitor where the H data has been rewritten, that of the ferroelectric capacitor where the H data has been written is larger, and hence, in this read operation, right data can be read.

This implies that a read error can be prevented by reading data with a smaller energy than the energy used in a write operation, and that a read error can be prevented by conducting a data rewrite operation under conditions for inverting the polarity of the polarization. These two matters are very significant to prevent a read error in the structure of a ferroelectric memory system and the driving method.

Next, dependency characteristics on the applied voltage and the temperature of the polarization in a write and rewrite operation of a ferroelectric capacitor, which have been found through experiments by the present inventors, will be described.

Figure 7:
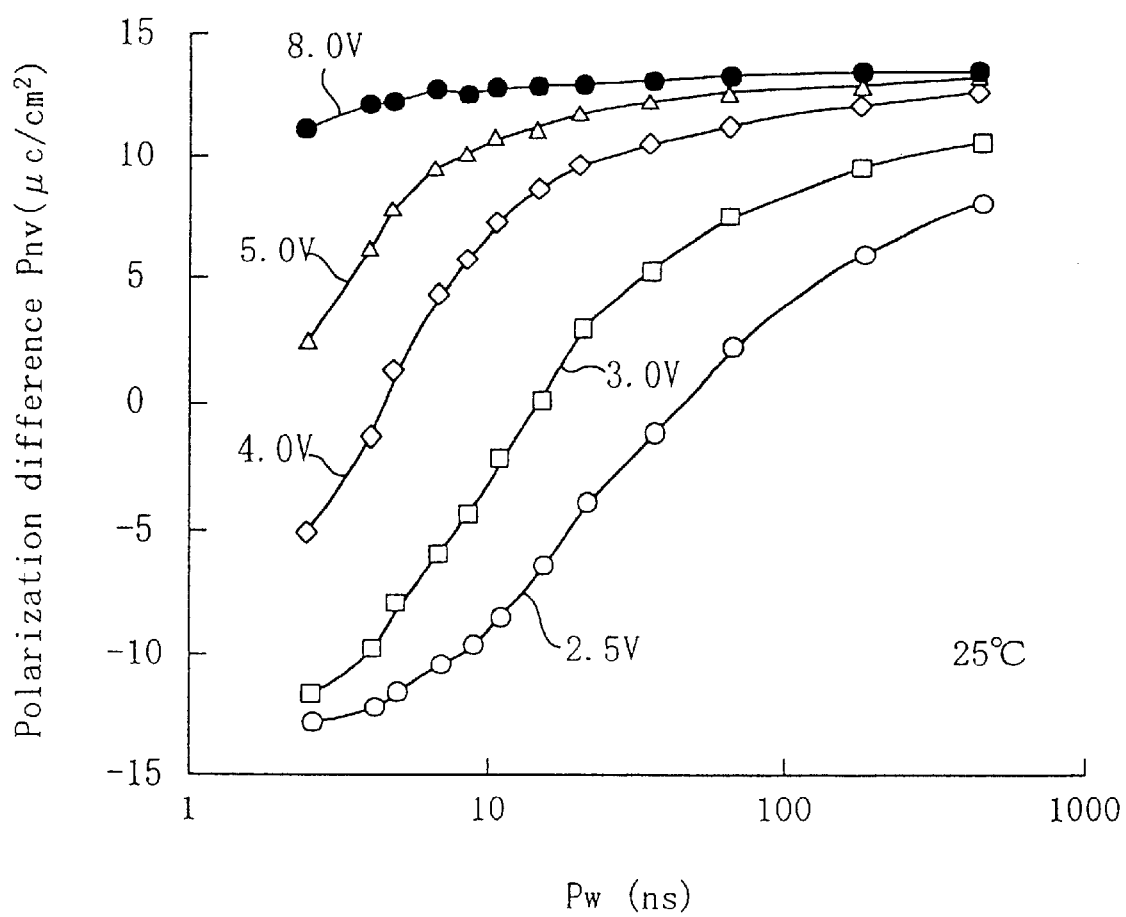
FIG. 7 is a diagram for showing application time dependency of a polarization difference between H data and L data by using a voltage as a parameter in a write operation of a ferroelectric memory system conducted in the process for achieving the invention.
Figure 14:
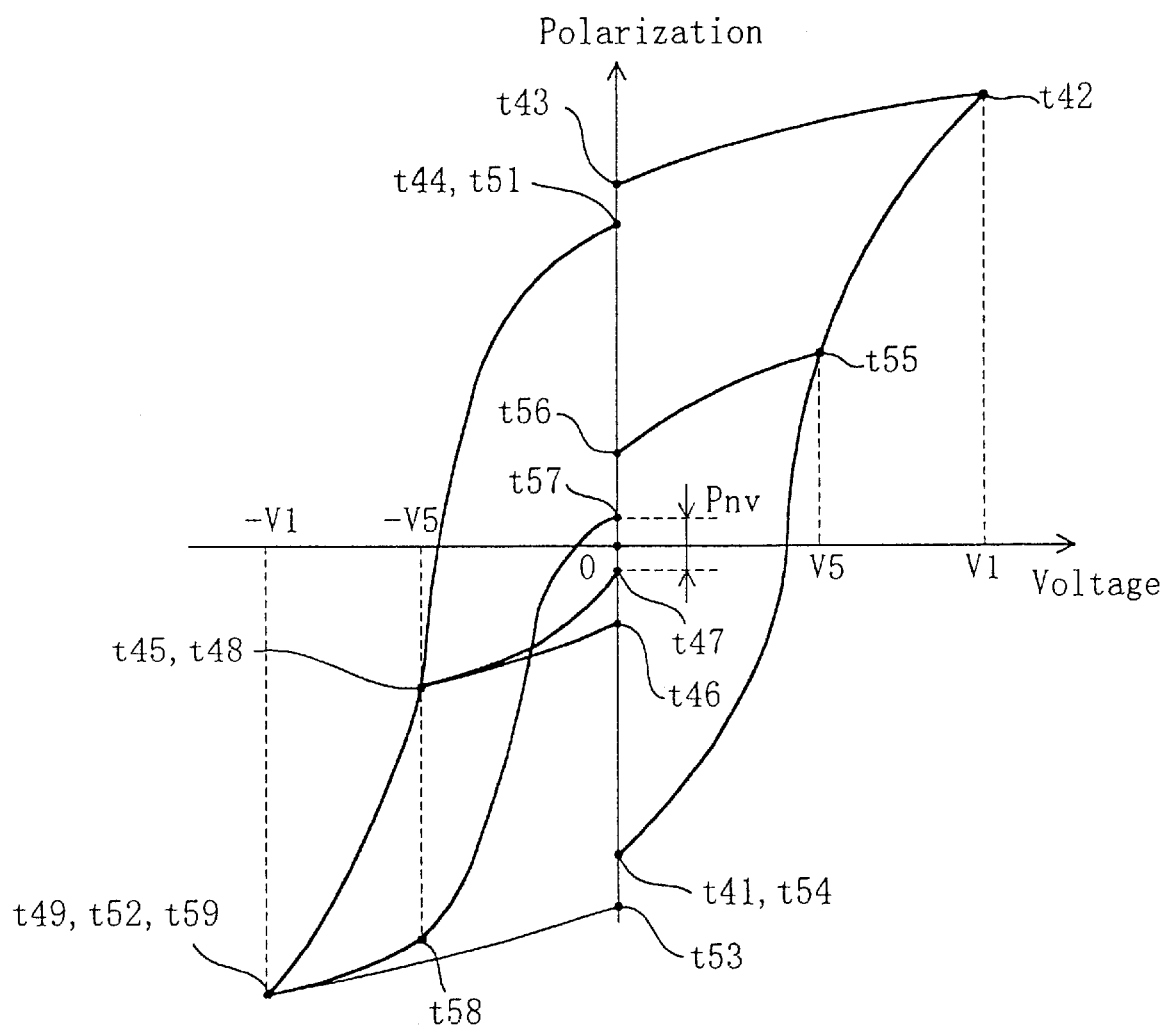
FIG. 14 is a hysteresis characteristic diagram for showing polarized states of a ferroelectric capacitor in write and read operations of a ferroelectric memory system according to a third embodiment of the invention.

FIG. 7 is a diagram for showing a result of examination on a change of the polarization difference Pnv in accordance with a pulse width of a voltage signal in a write and rewrite operation. As a ferroelectric material, a material designated as SBT including strontium, bismuth, titanium and niobium is used, and the ferroelectric film has a thickness of 240 nm. Also, the experiment is carried out at a temperature of 25° C. In FIG. 7, the abscissa indicates a pulse width (time duration) of a pulse signal applied between electrodes of the ferroelectric capacitor, and the ordinate indicates the polarization difference Pnv. A voltage value shown beside each change curve indicates a voltage of the pulse signal. In this polarization inversion, a high voltage is applied for a long period of time until the polarization is sufficiently saturated in a write operation, and then, data is rewritten by supplying a rewrite signal with a voltage value and a pulse width shown in the diagram. Furthermore, the polarization difference Pnv has a negative value in the case where the polarity attained after the rewrite operation is not changed from the polarity before the rewrite operation as is shown in FIG. 6, and has a positive value in the case where the polarity attained after the rewrite operation is opposite to the polarity before the rewrite operation as is shown in FIG. 14 described below.

Figure 8:
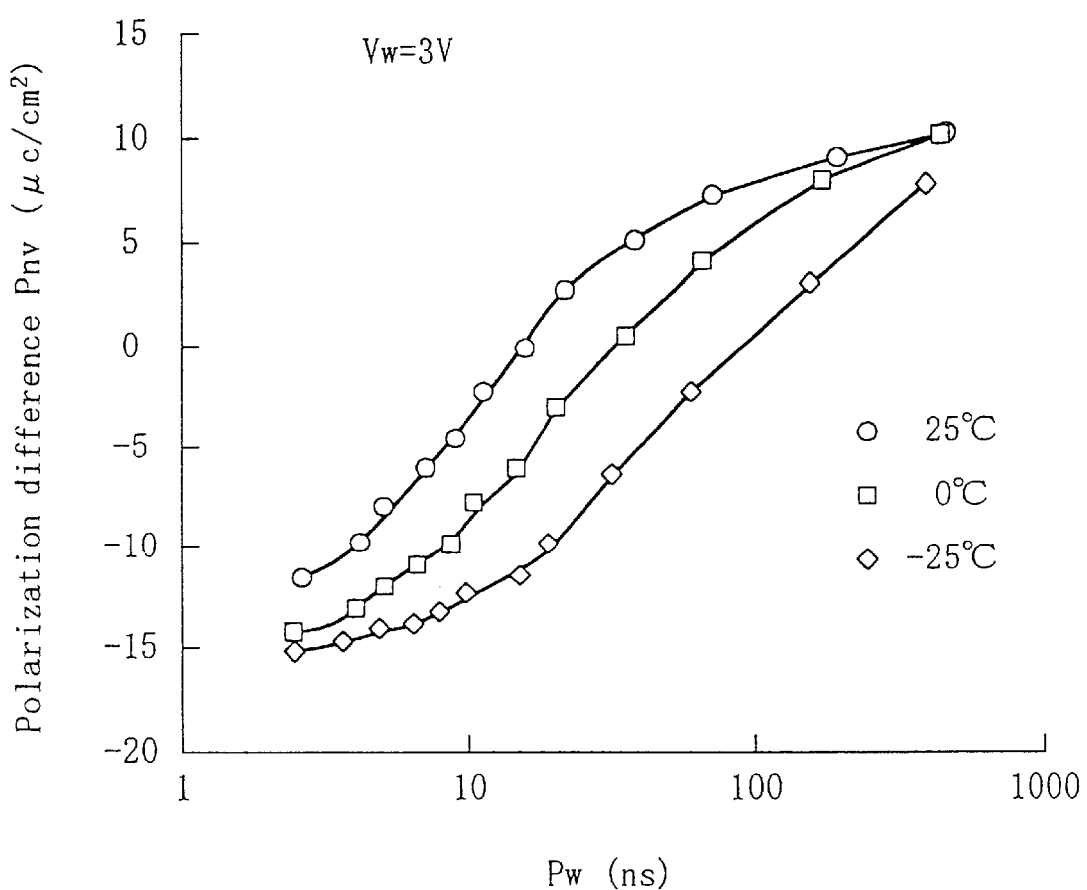
FIG. 8 is a diagram for showing application time dependency of a polarization difference between H data and L data by using a temperature as a parameter in a write operation of a ferroelectric memory system conducted in the process for achieving the invention.

FIG. 8 is a diagram for showing a result of examination of a change of the polarization difference Pnv in accordance with a pulse width obtained through a similar experiment to that of FIG. 7 with the pulse voltage fixed to 3 V and with the temperature used as a parameter. As is obvious from FIG. 8, the polarization inversion is more difficult to occur at a lower temperature. The data shown in FIGS. 7 and 8 reveal that the polarization inversion (rewrite) at a low voltage and a low temperature requires a long time. Most of ferroelectric capacitor films are generally polycrystal, and in this case, respective domains constituting the polycrystal include those easy to polarize and those difficult to polarize. When a voltage is applied to a ferroelectric capacitor made from such polycrystal, the polarization inversion starts from a domain easy to polarize, and since a charge generated or absorbed in the polarization inversion of the easily polarized domain is small, the hysteresis characteristic behaving in accordance with the aforementioned rule is obtained.

The pulse width of a pulse signal shown in this diagram relates to the energies of a write operation and a read operation described above.

Therefore, in the following embodiments, description will be given on specific configurations and driving methods of a ferroelectric memory system that can achieve the objects such as a high speed operation and prevention of a read error by utilizing the characteristics of a ferroelectric capacitor found through the aforementioned experiments.

Embodiment 1

Figure 9:
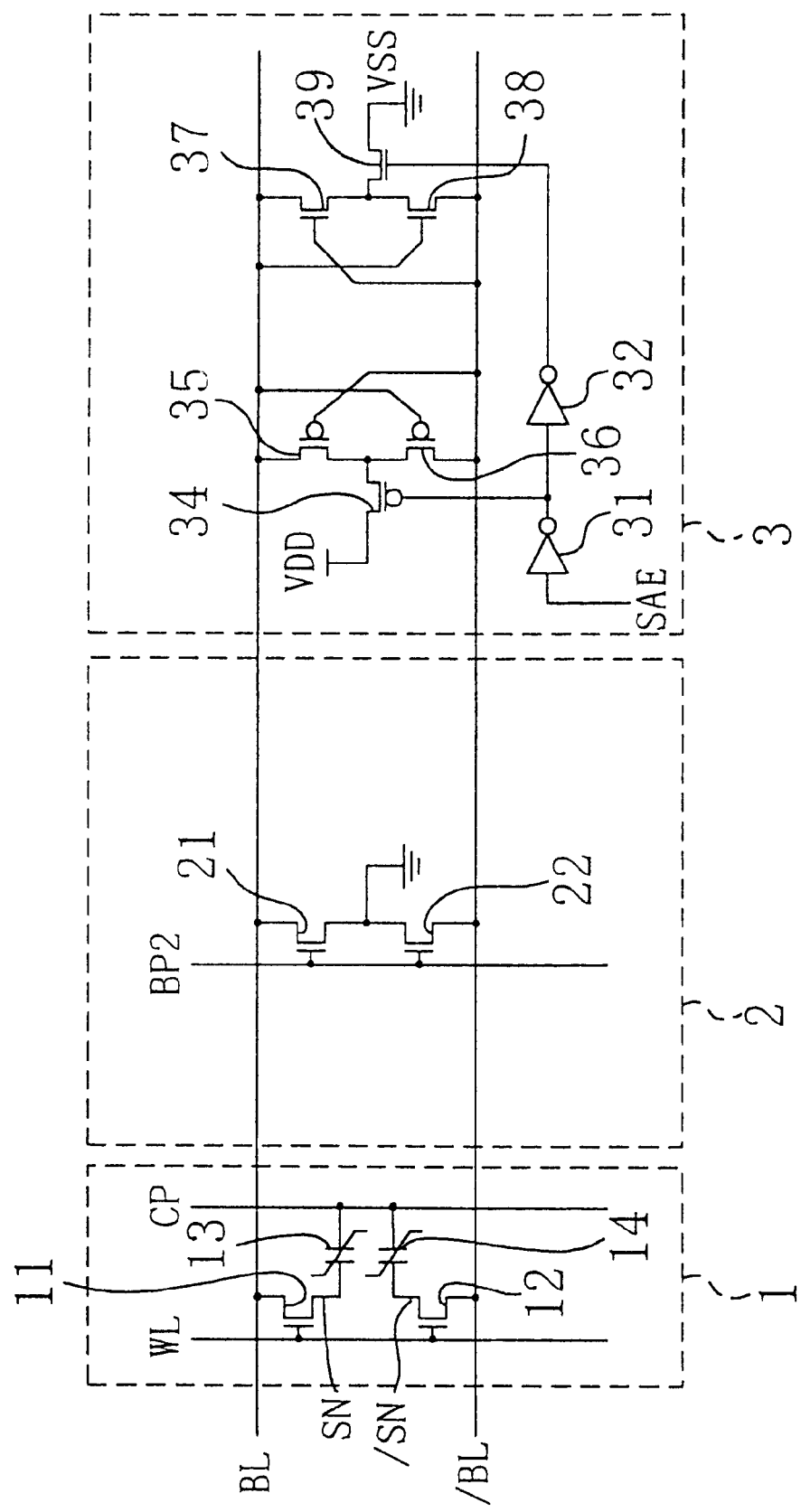
FIG. 9 is an electric circuit diagram for showing the configuration of a main part of a ferroelectric memory system according to a first embodiment of the invention.

FIG. 9 is an electric circuit diagram for showing the configuration of a 2T2C ferroelectric memory system according to this embodiment. In FIG. 9, a reference numeral 1 denotes a memory cell, a reference numeral 2 denotes a bit line voltage control circuit and a reference numeral 3 denotes a sense amplifier circuit. Also, BL and /BL indicate bit lines (/BL is designated also as an inverted bit line), SN and /SN indicate data storage nodes, WL indicates a word line, CP indicates a cell plate line, BP2 indicates a bit line voltage control signal line, and SAE indicates a sense amplifier control signal line.

Figure 20:
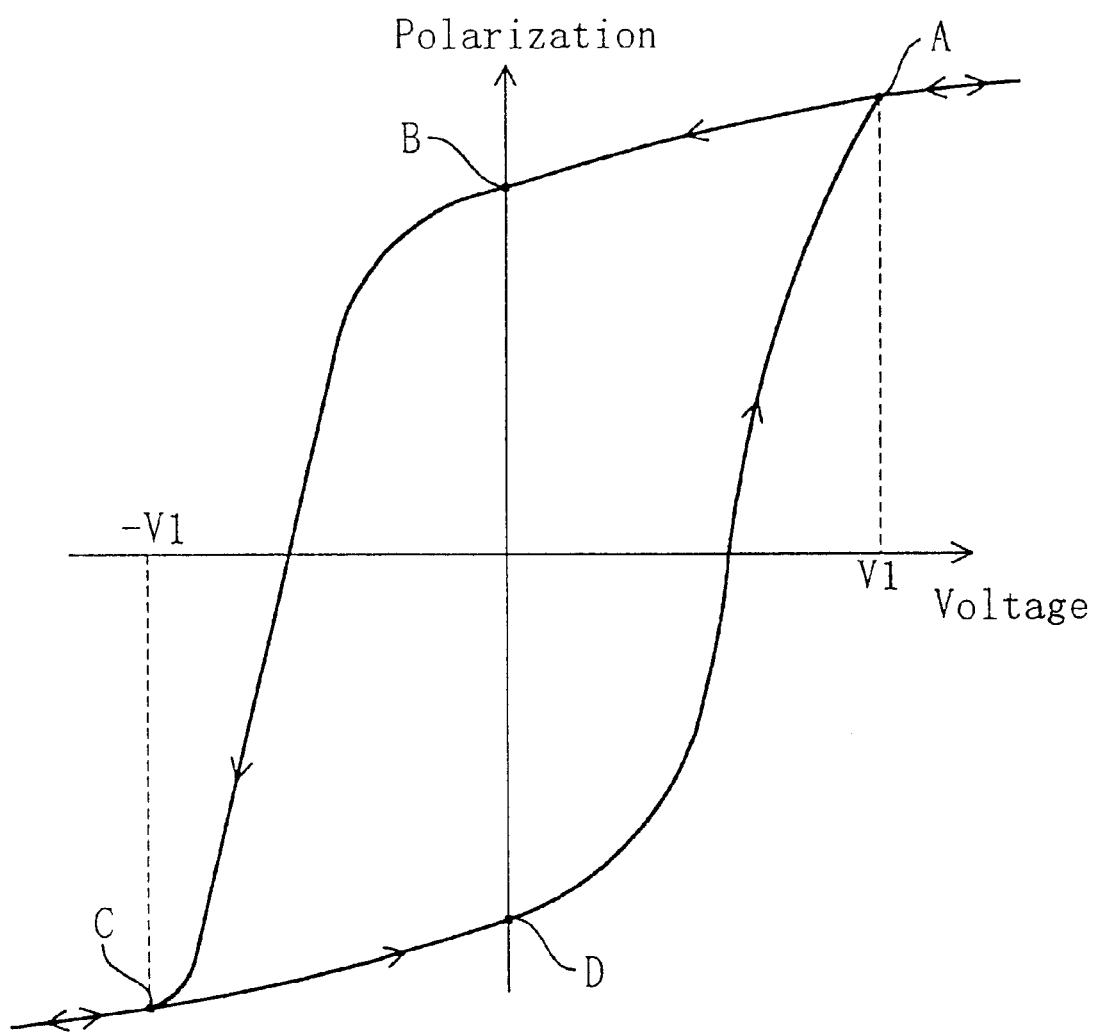
FIG. 20 is a hysteresis characteristic diagram of a ferroelectric material discussed in Background Art section of the specification.
Figure 21:
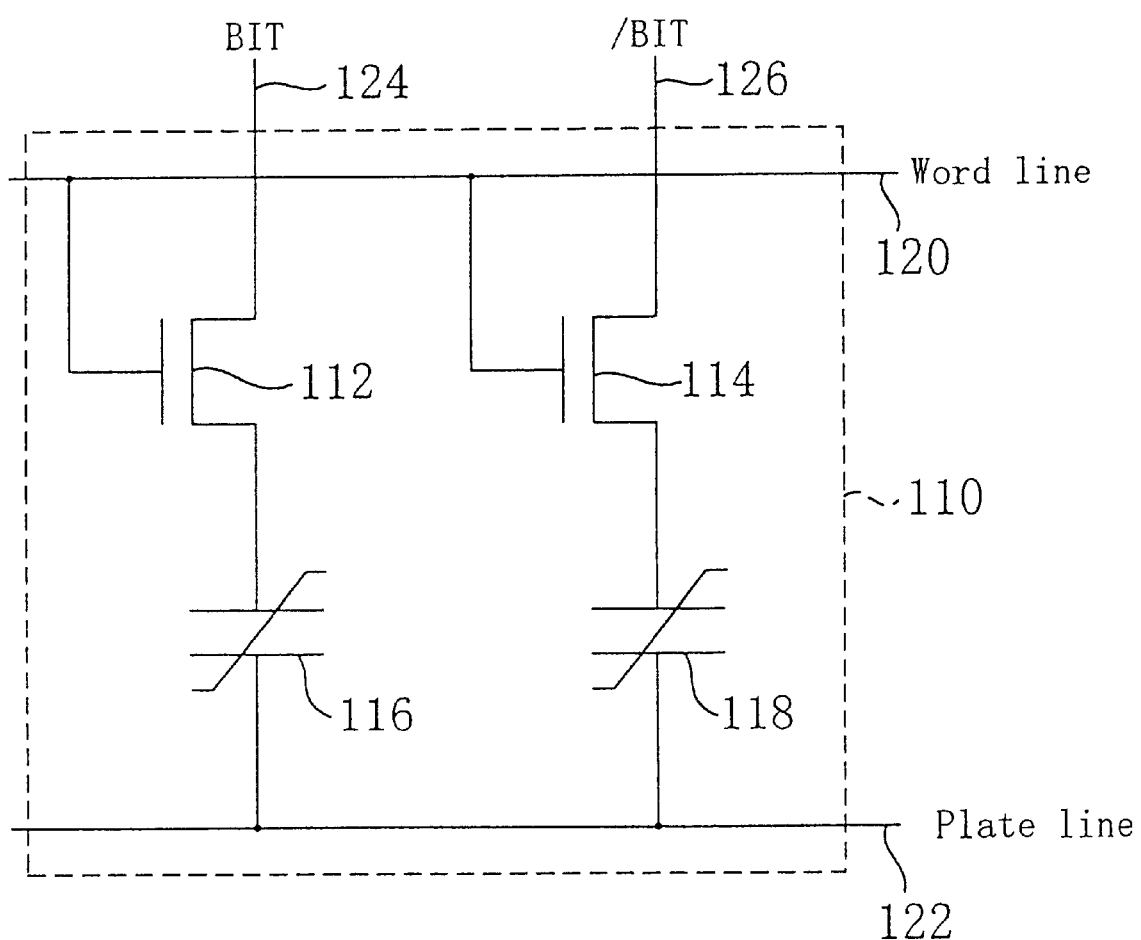
FIG. 21 is an electric circuit diagram for showing the configuration of a 2T2C memory cell in a ferroelectric memory system disclosed in a conventional publication.
Figure 22A:
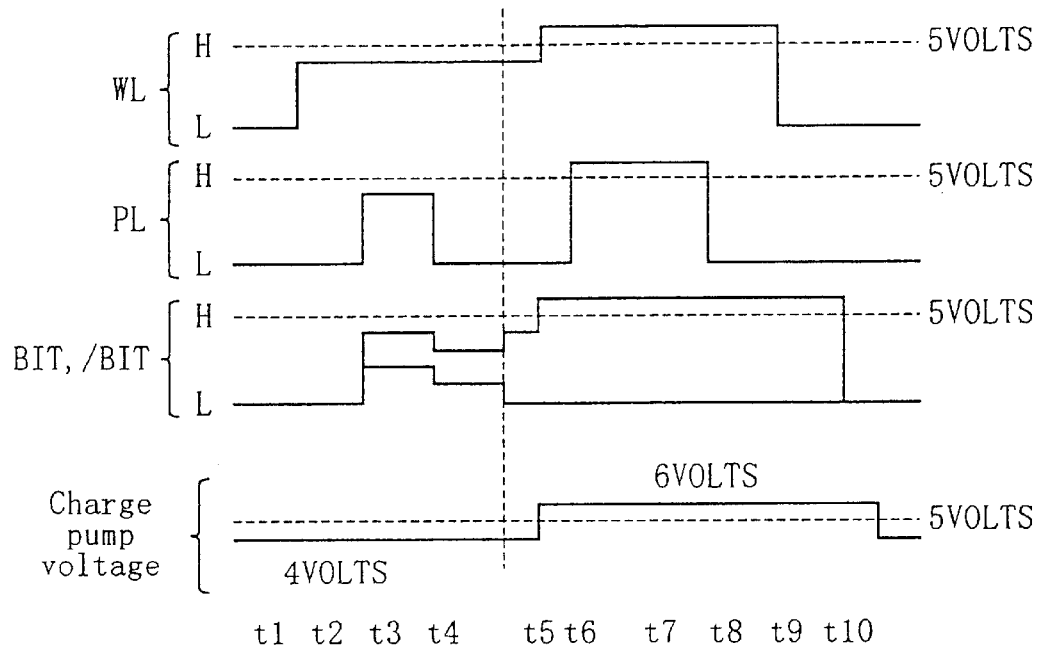
FIGS. 22(*a*) and 22(*b*) are timing charts for showing a read and write operation and a read and recovery operation of the ferroelectric memory system disclosed in the conventional publication.
Figure 22B:
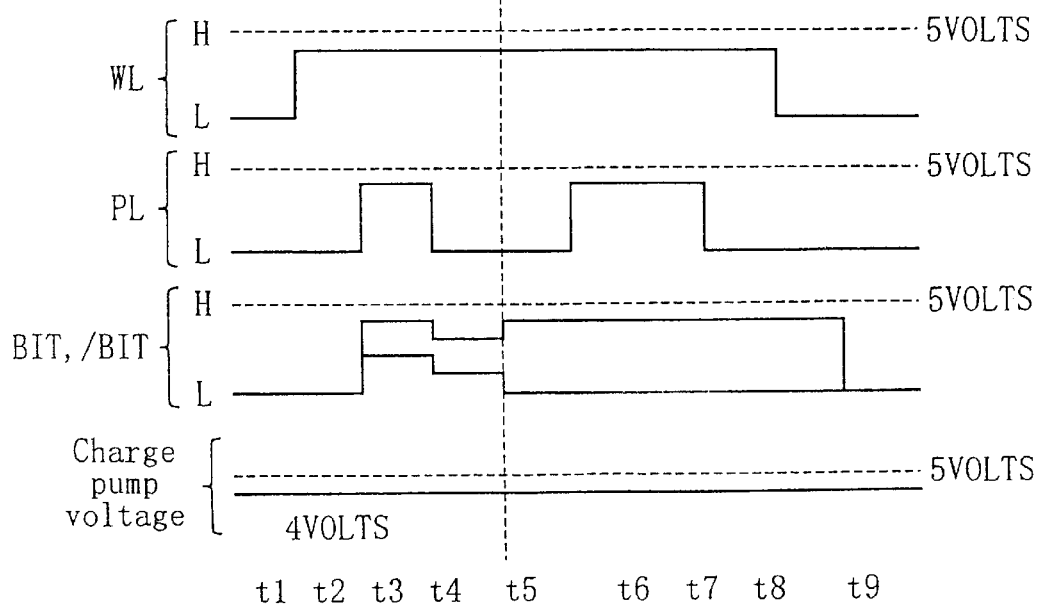

In the memory cell circuit 1, the drains of memory cell transistors 11 and 12 are connected with the bit lines BL and /BL, the sources thereof are connected with the data storage nodes SN and /SN, and the gates thereof are connected with the word line W1. Between the data storage nodes SN and /SN and the cell plate line CP, memory cell capacitors 13 and 14 each including a ferroelectric film are disposed. With one memory capacitor 113 supplied with a logical voltage L (0 V) at its electrode connected with the cell plate line and supplied with a logical voltage H at its electrode connected with the bit line, the residual polarization (H data) at the point B of FIG. 20 is given. Also, with the other memory cell capacitor 14 supplied with a logical voltage H at its electrode connected with the cell plate line and supplied with a logical voltage L at its electrode connected with the bit line, the residual polarization (assumed to be L data) at the point D of FIG. 20 is given. In this configuration, complementary data is adopted with such a polarized state of the two memory cell capacitors 13 and 14 used as data "1" and the opposite polarized state thereof used as data "0".

In the bit line voltage control circuit 2, between the bit lines BL and /BL and the ground, NMOS transistors 21 and 22 for voltage control are disposed, and the bit line voltage control signal line BP2 is connected with the gates of the NMOS transistors 21 and 22.

In the sense amplifier circuit 3, the sense amplifier signal line SAE is serially connected with first and second inverters 31 and 32. The output of the first inverter 31 is connected with the gate of a PMOS transistor 34 for driving pulse application. Also, between the bit lines BL and /BL, two PMOS transistors 35 and 36 together forming a differential amplification type sense amplifier are disposed, with the shared drain of the PMOS transistors 35 and 36 connected with the source of the PMOS transistor 34, and the drain of the PMOS transistor 34 is connected with a supply voltage terminal. Furthermore, the output of the second inverter 32 is connected with the gate of an NMOS transistor 39 for driving pulse application. Between the bit lines BL and /BL, two NMOS transistors 37 and 38 together forming another differential amplification type sense amplifier are disposed, with the shared source of the NMOS transistors 37 and 38 connected with the drain of the NMOS transistor 39, and the source of the NMOS transistor 39 is connected with ground. Specifically, the MOS transistors 34 and 39 are operated in accordance with a control signal on the sense amplifier signal line SAE for applying activation pulses to the two differential amplification type sense amplifiers, thereby amplifying a voltage difference (data) between the bit lines BL and /BL.

Figure 10:
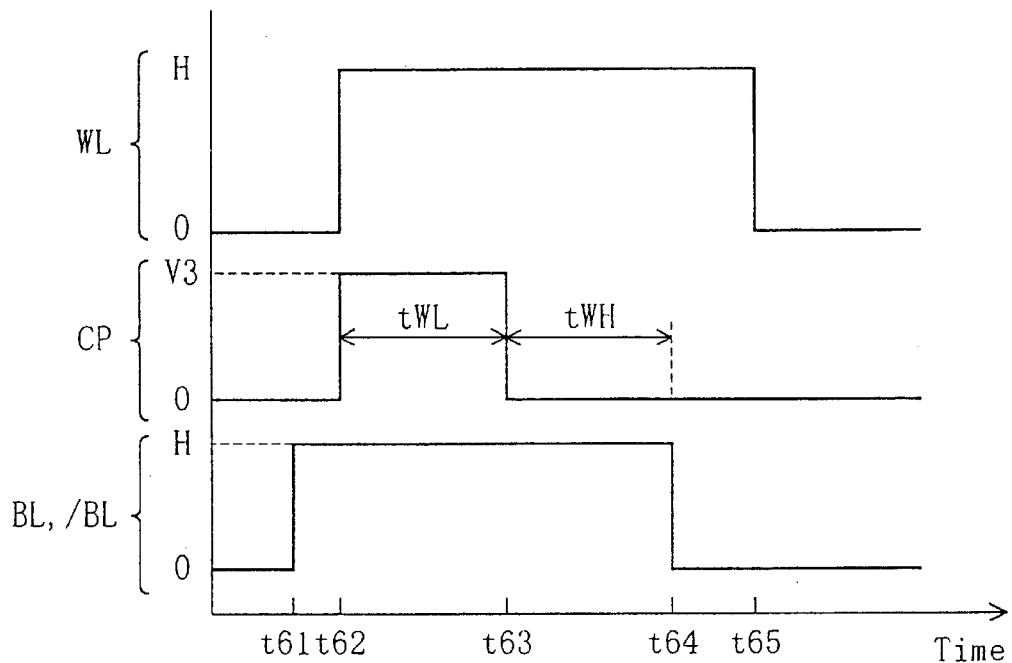
FIG. 10 is a timing chart for showing a write operation of ferroelectric memory systems according to the first and second embodiments of the invention.
Figure 11:
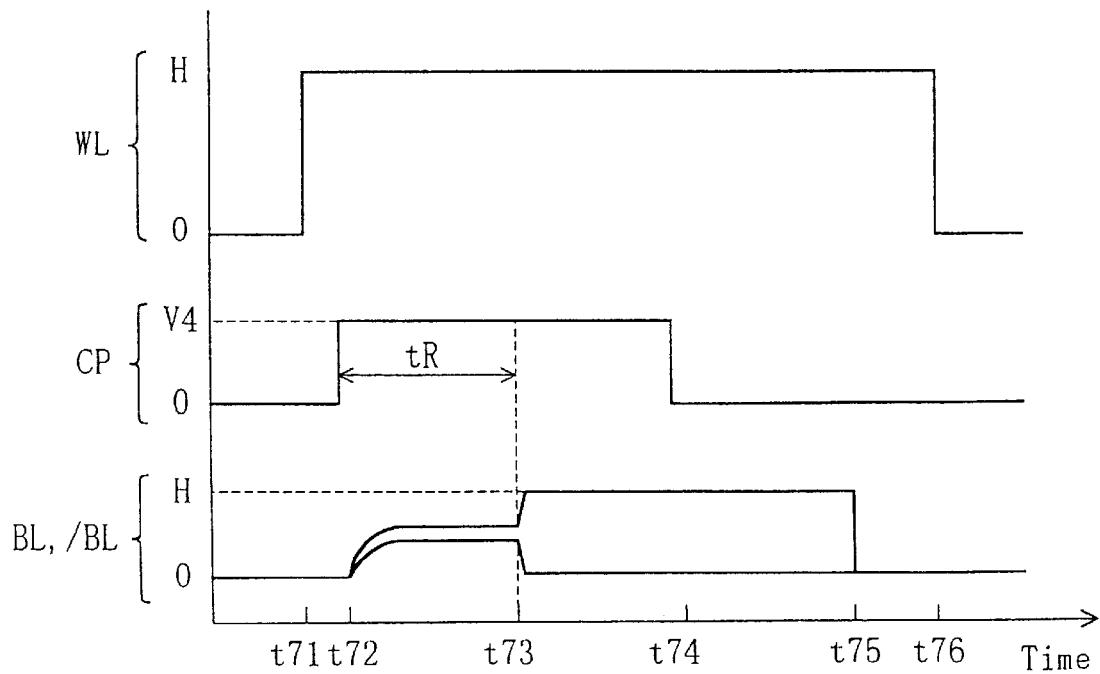
FIG. 11 is a timing chart for showing a read operation of the ferroelectric memory system of the first embodiment of the invention.

FIGS. 10 and 11 are timing charts for showing write and read operations of data "1" in the ferroelectric memory system of this embodiment.

As is shown in FIG. 10, a logical voltage H (V3) and a logical voltage L (0 V) are respectively applied to the bit line BL and the inverted bit lint /BL at a time t61, and at a time t62, the voltage on the word line WL is increased for turning on the memory cell transistors 11 and 12, and the logical voltage H (V3) is applied to the cell plate line CP. At this point, the potential at the electrode connected with the cell plate line of the memory cell capacitor 14 becomes H and the potential at the electrode thereof connected with the bit line becomes 0, and hence, L data is written (the polarized state at the point D of FIG. 20). Next, at a time t63, the logical voltage L (0 V) is applied to the cell plate line CP. At this point, the potential at the electrode connected with the cell plate line of the memory cell capacitor 13 becomes 0 and the potential at the electrode thereof connected with the bit line becomes H, and hence, H data is written (the polarized state at the point B of FIG. 20). Next, at a time t64, the voltage applied to the bit line BL is decreased to 0 V, and at a time t65, the voltage on the word line WL is decreased to 0 V, thereby turning off the memory cell transistors 11 and 12. In this manner, the write operation is completed.

Next, as is shown in FIG. 11, at a time t71, the voltage on the word line WL is increased for turning on the memory cell transistors 11 and 12, and at a time t72, a voltage V4 (V4<V3) is applied to the cell plate line CP. Thus, on the bit line BL and the inverted bit line /BL, voltages in accordance with the polarized state of the memory cell capacitors 13 and 14 and the line capacitances respectively appear. At this point, the potential of the bit line BL connected with the memory cell capacitor 13 storing the H data is higher than the potential of the inverted bit line /BL connected with the memory cell capacitor 14 storing the L data. At a time t73, the potential difference therebetween is sensed as data "1" through amplification by the sense amplifier SAE to a logical voltage H (V4) and a logical voltage L (0 V). At the same time, the L data is restored between the time t73 and a time t74, the voltage on the cell plate line CP is decreased to 0 V so as to restore the H data at the time t74, the potential of the bit line BL is decreased to 0 V at a time t75, and the potential of the word line WL is decreased to 0 V at a time t76, and thus, the read operation is completed.

In the driving method for a ferroelectric memory system of this embodiment, while the voltage V3 is applied between the electrode connected with the cell plate line and the electrode connected with the bit line in each of the memory cell capacitors 13 and 14 in the write operation, the voltage V4 lower than the voltage V3 is applied to the electrode connected with the cell plate line in the read operation. A voltage actually applied to a ferroelectric capacitor is a voltage defined by a ratio between a bit line capacitance (line capacitance) and a capacitance of a memory cell capacitor, and hence is lower than the voltage V4. Furthermore, with regard to the write time (pulse width), the write time for the L data is tWL and the write time for the H data is tWH. The read time is tR, and the respective times tWL, tWH and tR have substantially the same value. Specifically, the system is operated with a write energy larger than a read energy.

Accordingly, in the driving method for a ferroelectric memory system of this embodiment or in a ferroelectric memory system designed to be driven by this method, even when a write operation is not conducted until the saturation of polarization, merely data having been written with a given write energy is read without causing a read error as in the read operation at the times t49 and t59 of FIG. 6, and thus right data can be read. Furthermore, even when the polarization inversion as that caused in the rewrite operation as is shown in FIG. 6 is not caused, the polarization can be approximated to polarized states corresponding to the original H data and L data through the restore operation conducted between the times t73 and t75. Therefore, the normally polarized state can be attained through one read and restore operation at the earliest and through several read and restore operations at the latest.

Modification of Embodiment 1

Figure 12:
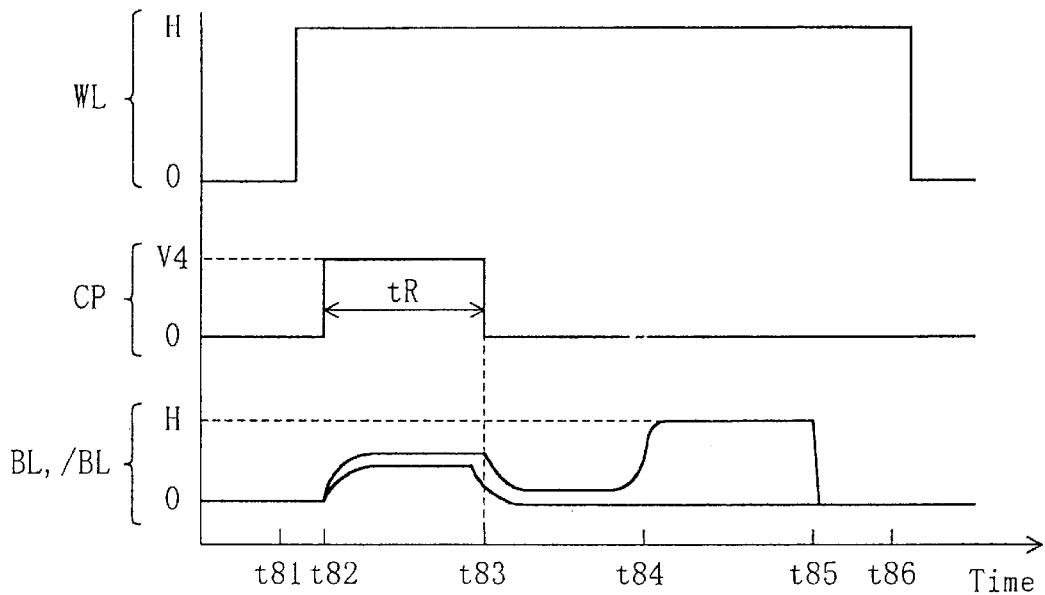
FIG. 12 is a timing chart for showing a read operation of a ferroelectric memory system according to a modification of the first embodiment of the invention.

FIG. 12 is a timing chart for showing a reading method of a ferroelectric memory system according to a modification of a second embodiment.

As is shown in FIG. 12, after turning on the memory cell transistors 11 and 12 by increasing the voltage on the word line WL at a time t81, a voltage V4 (V4<V3) is applied to the cell plate line CP at a time t82. Thus, on the bit line BL and the inverted bit line /BL, voltages in accordance with the polarized states of the memory cell capacitors 13 and 14 and the line capacitances respectively appear. Then, when the voltage on the cell plate line CP is decreased to 0 V at a time t83, the potentials of the bit line BL and the inverted bit line /BL are gradually decreased, but also in this case, the potential of the bit line BL connected with the memory cell capacitor 13 storing the H data is higher than the potential of the inverted bit line /BL connected with the memory cell capacitor 14 storing the L data. Then, at a time t84, the potential difference therebetween is sensed as data "1" through amplification by the sense amplifier SAE to a logical voltage H and a logical voltage L (0 V). The time tR (pulse width) between the times t82 and t83 is shorter than the times tWL and tWH shown in FIG. 10. At the same time, after the H data is restored between the times t84 and t85, the potential of the bit line BL is decreased to 0 V at the time t85, and the potential of the word line WL is decreased to 0 V at a time t86, and thus, the read operation is completed.

In the method of driving a ferroelectric memory system according to this embodiment, while the voltage V3 is applied between the electrode connected with the cell plate line and the electrode connected with the bit line in each of the memory cell capacitors 13 and 14 in the write operation, the voltage V4 lower than the voltage V3 is applied to the electrode connected with the cell plate line in the read operation. On the other hand, the read time is tR, which has substantially the same value as the L and H write times tWL and tWH. Specifically, the system is operated with a write energy larger than a read energy, and hence, the same effects as those of the first embodiment can be exhibited.

Also, application of the write pulse is herein conducted with one write pulse, but a voltage can be applied as plural write pulses, and in this case, a write pulse width for determining a write energy is substantially equal to a sum of the widths of the plural write pulses.

Embodiment 2

In this embodiment, a driving method in which a write voltage and a read voltage are the same and the intensities of a write energy and a read energy are controlled in accordance with a difference between a write time and a read time will be described.

Figure 13:
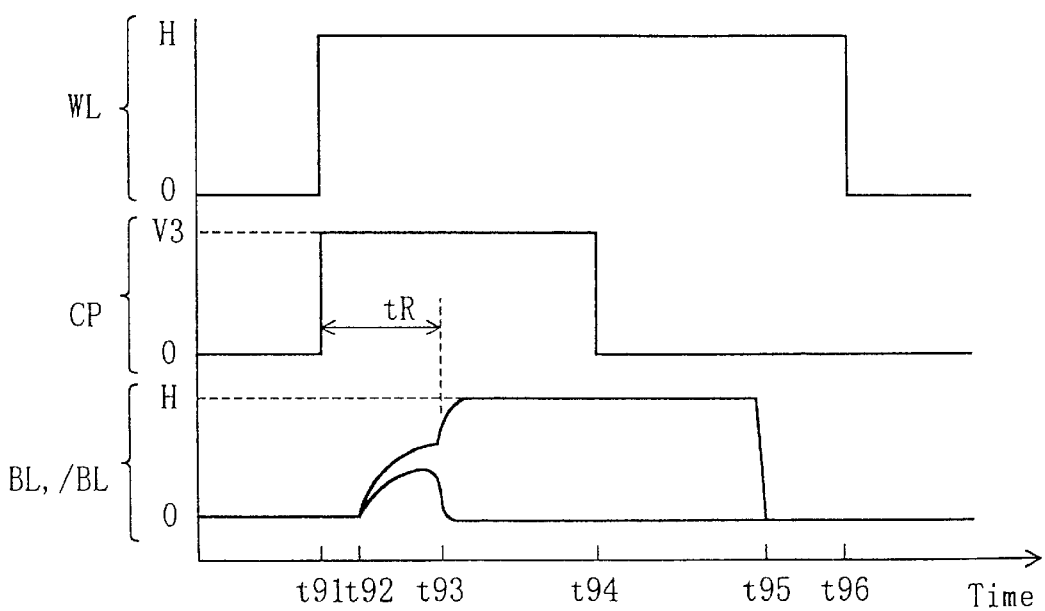
FIG. 13 is a timing chart for showing a read operation of the ferroelectric memory system of the second embodiment of the invention.

Also in this embodiment, a data writing method is conducted in accordance with the timing chart of FIG. 10 described above. FIG. 13 is a timing chart for showing a read operation of this embodiment.

As is shown in FIG. 13, after turning on the memory cell transistors 11 and 12 by increasing the voltage on the word line WL from a logical voltage L to a logical voltage H at a time t91, a voltage V3 is applied to the cell plate line CP at a time t92. Thus, on the bit line BL and the inverted bit line /BL, voltages in accordance with the polarized states of the memory cell capacitors 13 and 14 and the line capacitances respectively appear. At this point, the potential of the bit line BL connected with the memory cell capacitor 13 storing the H data is higher than the potential of the inverted bit line /BL connected with the memory cell capacitor 14 storing the L data. Then, at a time t93, the potential difference therebetween is sensed as data "1" through amplification by the sense amplifier SAE to a logical voltage H and a logical voltage V (0 V). The time tR (pulse width) between the times t92 and t93 is shorter than the times tWL and tWH shown in FIG. 10. At the same time, the L data is restored (released) between the times t93 and t94, and then, after restoring the H data with the voltage on the cell plate line CP decreased to 0 V at the time t94, the potential of the bit line BL is decreased to 0 V at a time t95, and the potential of the word line WL is decreased to 0 V at a time t96, and thus, the read operation is completed.

In the method of driving a ferroelectric memory system of this embodiment, the read and write voltages are both V3, but the read time is shorter than the write time. Specifically, the read time is tR, which is shorter than the H and L data write times tWL and tWH. Accordingly, the system is operated with a write energy larger than a read energy as in the first embodiment.

In a ferroelectric memory system designed to be thus operated, merely data having been written with a given write energy is read, and hence, right data can be read. In particular, the driving method of this embodiment is more simple in its circuit configuration than that of the first embodiment because a circuit for controlling a voltage is not required but the voltage can be controlled in accordance with a pulse time.

At this point, within a specified temperature range of a device, the relationship between the temperature and the pulse width can be set in accordance with a characteristic of the ferroelectric capacitor by a method described in an embodiment below. Specifically, in consideration of the aforementioned characteristic of FIG. 8, the pulse width can be set to be larger at a lower temperature.

Embodiment 3

In this embodiment, a ferroelectric memory system in which no read error is caused regardless of the intensity of a read energy will be described. The ferroelectric memory system of the first or second embodiment can be normally operated with a write energy larger than a read energy, but the ferroelectric memory system of this embodiment can be normally operated even when a read energy is larger.

FIG. 14 is a hysteresis characteristic diagram of a ferroelectric capacitor for showing a change of the polarized state attained by a writing (rewriting) and reading method for the ferroelectric memory system of this embodiment. Also in this embodiment, it is assumed that write, rewrite and read operations as is shown in FIGS. 4 and 5 are conducted, and times t41 through t49 and times t51 through t59 of FIG. 14 correspond to the times shown in FIGS. 3 and 4.

In FIG. 14, a state attained after rewriting L data corresponds to the state at a point of the time t47, and a state attained after rewriting H data corresponds to the state at a point of the time t57. The polarized state corresponding to the L data has a negative polarity below the origin O, and the polarized state corresponding to the H data has a positive polarity above the origin O. Accordingly, the polarization difference Pnv is a positive value. In this manner, as a characteristic of the rewriting method of this embodiment, a rewrite operation is conducted with a voltage and a pulse width which can allow the polarization difference Pnv between the H data and the L data obtained through the polarization inversion in the rewrite operation to have a positive value. Such a rewriting method can be definitely reproduced by setting the polarization difference Pnv at a positive value on the basis of the relationship between the write voltage and the write pulse width shown as the data of FIG. 7 or 8. As described above, the polarization difference Pnv shown in FIGS. 7 and 8 is data obtained after the relaxation. When the characteristics as is shown in FIGS. 7 and 8 are not known as in the conventional technique, it is difficult to definitely reproduce a positive polarization difference as is shown in FIG. 14 while conducting a rewrite operation with the polarization of a ferroelectric capacitor retained unsaturated.

As a result, in the read operation at the times t49 and t59 in this embodiment, when a change of the polarization between the time t47 to the time t49 of the ferroelectric capacitor where the L data has been rewritten is compared with a change of the polarization between the time t57 and the time t59 of the ferroelectric capacitor where the H data has been rewritten, that of the ferroelectric capacitor where the H data has been rewritten is larger. Therefore, in this read operation, the read data accords with the right data. In this embodiment, data is rewritten at a voltage V5, and the rewrite voltage can be any voltage higher than V5.

Specifically, in this embodiment, with the characteristics of FIGS. 7 and 8 previously grasped, a write operation is conducted in a manner that the polarized state of the H data is in the positive direction of the polarized state of the L data after the polarization inversion and after the relaxation. Thus, even when a write (rewrite) operation is conducted with the polarization of a ferroelectric capacitor unsaturated, the system can be effectively normally operated at any read voltage with any read pulse width (time duration).

Embodiment 4

In a fourth embodiment, description will be given on a ferroelectric memory system in which temperature dependency of a write energy is reduced by optimally setting an internal voltage by using an internal voltage generation circuit.

Figure 15A:
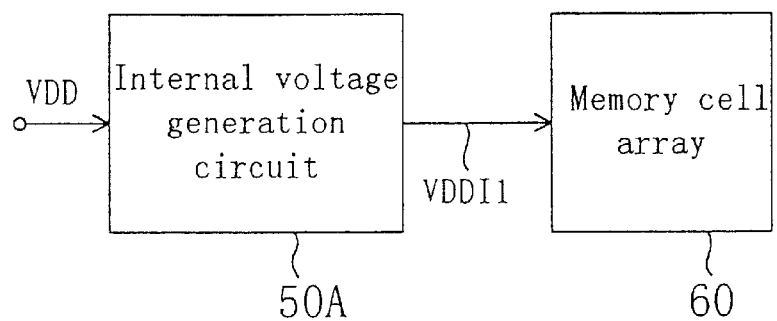
FIGS. 15(*a*) and 15(*b*) are a schematic block circuit diagram for showing the configuration of a ferroelectric memory system according to a fourth embodiment of the invention and an electric circuit diagram for showing an exemplified configuration of an internal voltage generation circuit, respectively.

FIG. 15(a) is a block circuit diagram for showing the configuration of a characteristic part of the ferroelectric memory system of this embodiment. As is shown in FIG. 15(a), the ferroelectric memory system of this embodiment includes an internal voltage generation circuit 50A which receives an external voltage VDD and generates an internal voltage VDDI1. This internal voltage VDDI1 is input to a memory cell array 60 in which memory cells 1 as is shown in FIG. 9 are disposed in an array, so that data can be written (rewritten) with this internal voltage VDDI1 in mail cell capacitors.

Figure 16:
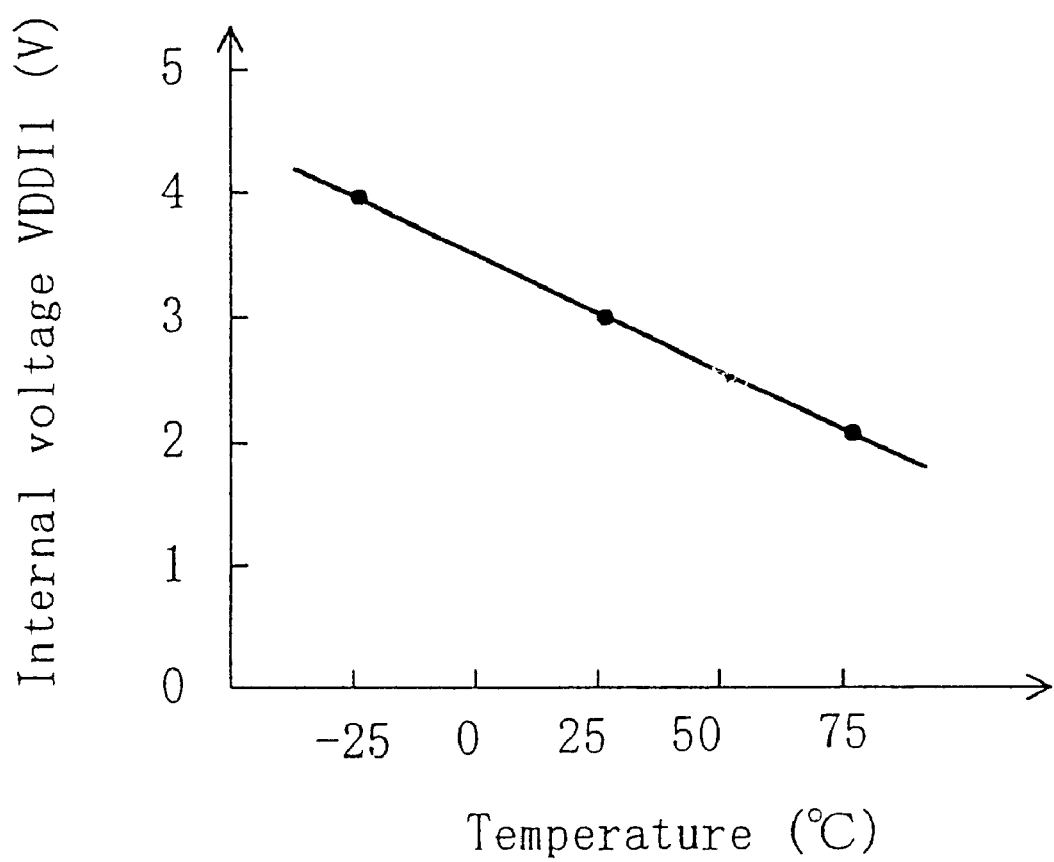
FIG. 16 is a diagram for showing temperature dependency of an internal voltage of the ferroelectric memory system of the fourth embodiment of the invention.

FIG. 16 is a diagram for showing an example of the temperature dependency characteristic of the internal voltage VDDI1 used in this embodiment. The internal voltage VDDI1 is designed to be higher as the temperature is lower as is shown in FIG. 16. In this case, it is premised that the application time (pulse width) of a write (including rewrite) voltage is fixed. Such setting cannot be achieved until the temperature dependency of the polarization difference Pnv as is shown in FIGS. 7 and 8 is grasped.

In the ferroelectric memory system of this embodiment, since the write voltage is set high at a low temperature by adopting the circuit configuration as is shown in FIG. 15(a), the characteristic of a ferroelectric capacitor that data is difficult to be rewritten at a low temperature can be compensated, and a rewrite operation for causing a polarized state sufficient for not causing a read error can be realized in a wide range of the temperature. In other words, a sufficient write operation can be conducted at a low temperature, and the temperature dependency of the writing characteristic can be reduced, resulting in realizing an operation at a low temperature.

Figure 15B:
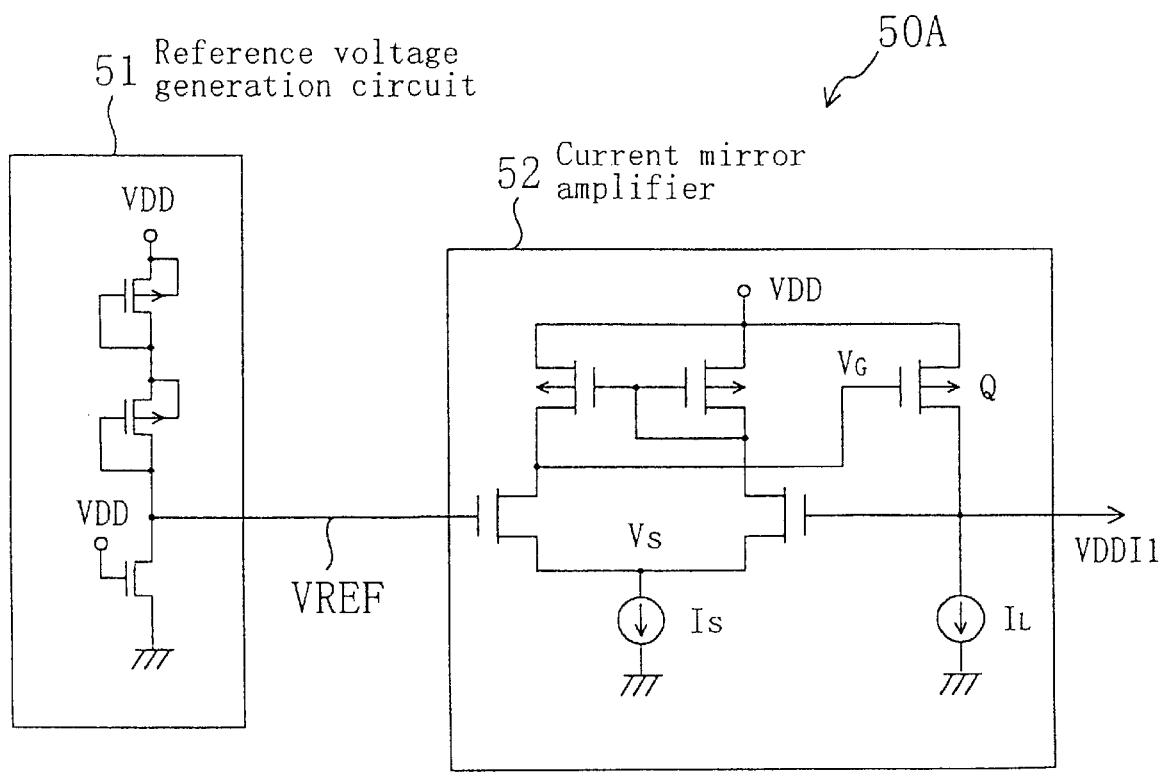

FIG. 15(b) is an electric circuit diagram for showing an example of the configuration of the internal voltage generation circuit 50A. As is shown in FIG. 15(b), the internal voltage generation circuit 50A can include a reference voltage generation circuit 51 for receiving the external voltage VDD and generating a reference voltage VREF, and a current mirror amplifier 52 for receiving the reference voltage VREF generated by the reference voltage generation circuit 51 and outputting the internal voltage VDDI1 through amplification of the reference voltage VREF. In this case, since the reference voltage VREF is determined on the basis of the threshold value of a P-channel MOS transistor included in the reference voltage generation circuit 51, it is easy to make the reference voltage VREF have the temperature dependency to be higher at a lower temperature.

Embodiment 5

In a fifth embodiment, description will be given on a ferroelectric memory system in which change of the polarized state derived from temperature dependency of a write energy is suppressed by using a pulse signal generation circuit using a voltage of an internal voltage generation circuit as a voltage source.

Figure 17A:
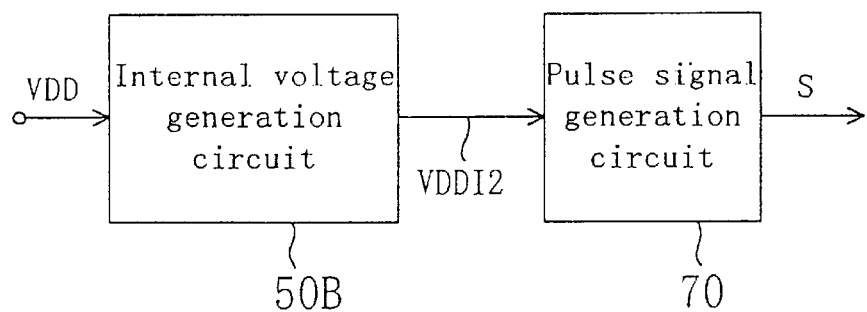
FIGS. 17(*a*), 17(*b*) and 17(*c*) are a schematic block circuit diagram for showing he configuration of a ferroelectric memory system according to a fifth embodiment of the invention, an electric circuit diagram for showing an exemplified configuration of an internal voltage generation circuit and an electric circuit diagram for showing an exemplified configuration of a pulse signal generation circuit, respectively.

FIG. 17(a) is a block circuit diagram for showing the configuration of a characteristic part of the ferroelectric memory system of this embodiment. As is shown in FIG. 17(a), the ferroelectric memory system of this embodiment includes an internal voltage generation circuit 50B which receives an external voltage VDD and generates an internal voltage VDDI2, and a pulse signal generation circuit 70 which receives the internal voltage VDDI2 and outputs a pulse signal S.

Figure 18:
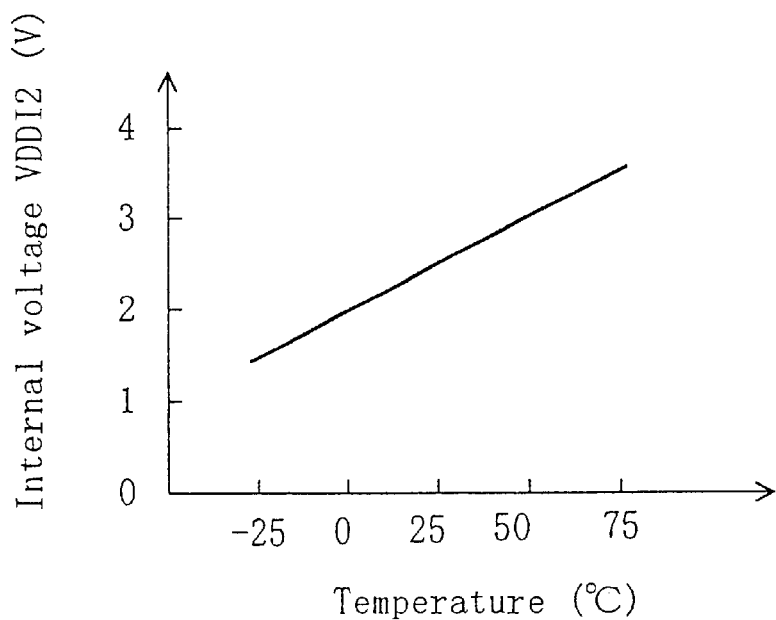
FIG. 18 is a diagram for showing temperature dependency of an internal voltage of the ferroelectric memory system of the fifth embodiment of the invention.
Figure 19:
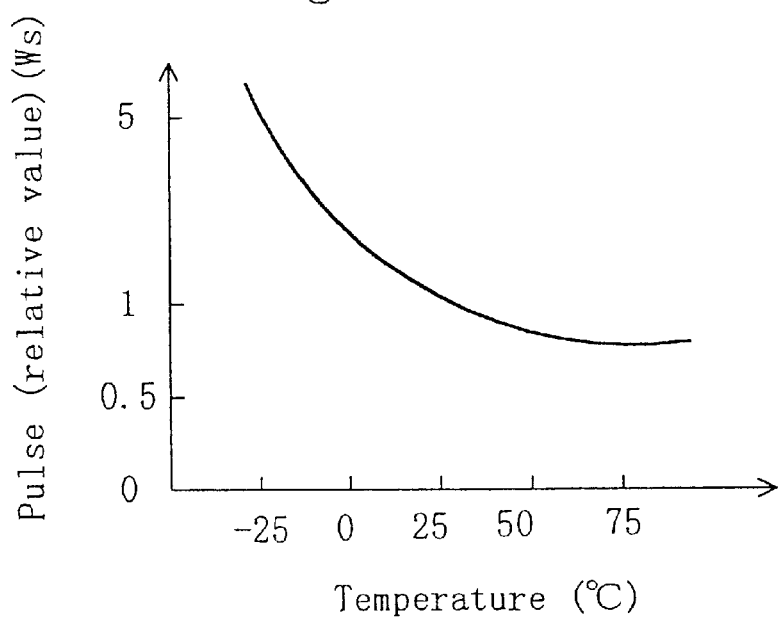
FIG. 19 a diagram for showing temperature dependency of a pulse width of a signal generated from a pulse signal of the ferroelectric memory system of the fifth embodiment of the invention.

FIG. 18 is a diagram for showing an example of the temperature dependency characteristic of the internal voltage VDDI2 output by the internal voltage generation circuit 50B. Also, FIG. 19 is a diagram for showing the temperature dependency of a pulse width Ws of the pulse signal S output by the pulse signal generation circuit 70. As is shown in FIGS. 18 and 19, the internal voltage VDDI2 is designed to be lower as the temperature is lower, and hence, the pulse signal width (Ws) of the signal S generated by the pulse signal generation circuit 70 is larger as the temperature is lower. As a result, when this signal S is used as a write (including rewrite) pulse signal, the temperature dependency characteristic of a write energy can be compensated so as to attain a desired polarized state. Such setting cannot be realized until the temperature dependency of the polarization difference Pnv as is shown in FIGS. 7 and 8 is grasped.

According to this embodiment, the characteristic of a ferroelectric capacitor that a rewrite operation is difficult to conduct at a low temperature can be compensated by elongating the write pulse width at a low temperature, and hence, a rewrite operation for causing sufficient polarization for not causing a read error can be realized in a wide range of the temperature. Specifically, since the write pulse width is increased at a lower temperature in accordance with the polarization inversion characteristic of a ferroelectric capacitor, a write operation for attaining sufficient polarization at a lower temperature can be conducted, the temperature dependency of the writing characteristic can be reduced, and the operation at a low temperature can be realized.

In particular, in the configuration of this embodiment, current consumption can be decreased because the pulse width is controlled instead of changing the source of a voltage to be applied to a ferroelectric capacitor as in the fourth embodiment.

Figure 17B:
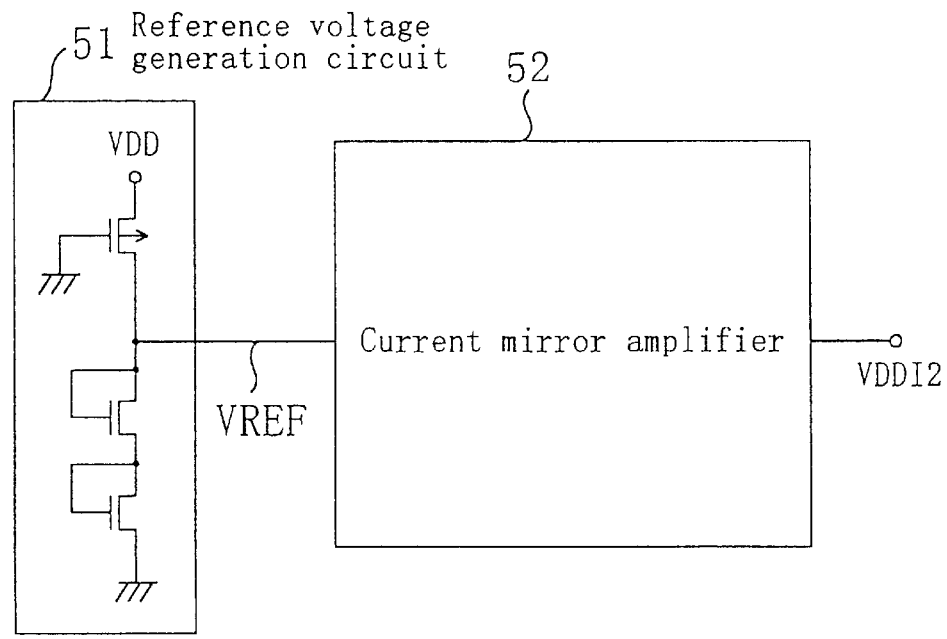

FIG. 17(b) is an electric circuit diagram for showing an example of the configuration of the internal voltage generation circuit 50B. As is shown in FIG. 17(b), the internal voltage generation circuit 50B can include a reference voltage generation circuit 53 for receiving the external voltage VDD and generating a reference voltage VREF, and a current mirror amplifier 52 for receiving the reference voltage VREF generated by the reference voltage generation circuit 53 and outputting the internal voltage VDDI2 through amplification of the reference voltage VREF. The current mirror amplifier 52 has a configuration, for example, as is shown in FIG. 15(b). In this case, since the reference voltage VREF is determined on the basis of the threshold value of an N-channel MOS transistor included in the reference voltage generation circuit 53, it is easy to make the reference voltage VREF have the temperature dependency to be lower at a lower temperature.

Figure 17C:
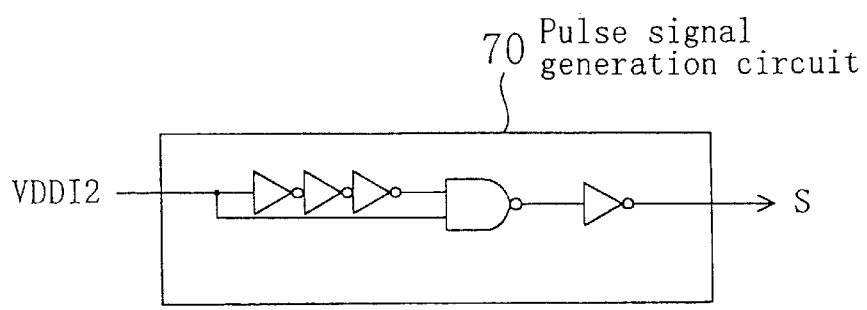

Furthermore, FIG. 17(c) is an electric circuit diagram for showing an example of the configuration of the pulse signal generation circuit 70.

It is noted that the fourth embodiment and the fifth embodiment can be combined.

By utilizing the operation characteristics of a ferroelectric capacitor herein described, a stably operable device can be realized in consideration of the relaxation, that is, the polarization decrease of a ferroelectric capacitor, and imprint, that is, a bias phenomenon of the polarization of a ferroelectric capacitor derived from application of a high voltage and storage at a high temperature. Furthermore, a 2T2C memory cell structure is herein described as the embodiment, but the invention is applicable to a ferroelectric memory system including 1T1C memory cells or a ferroelectric memory system including 2T1C memory cells. This is because, also in such cases, the polarized state of a ferroelectric capacitor in each memory cell is not basically different from the polarized state of each ferroelectric capacitor in the 2T2C memory cell.

INDUSTRIAL APPLICABILITY

The ferroelectric memory system of this invention can be used, for example, as a semiconductor memory system contained in a variety of types of electronic equipment, and in particular, is suitable to a nonvolatile RAM.

What claimed is:

1. A ferroelectric memory system comprising:
   a bit line;
   a cell plate line;
   a ferroelectric capacitor including a ferroelectric film and disposed between said bit line and said cell plate line;
   a memory cell transistor disposed between said bit line and said ferroelectric capacitor; and
   a writing control circuit for supplying a first energy for polarizing said ferroelectric film of said ferroelectric capacitor between said cell plate line and said bit line,
   wherein said writing control circuit controls said first energy in a manner that said ferroelectric film is placed in substantially the same polarized state against a temperature change and said writing control circuit controls to conduct a write operation at a higher voltage when a temperature is lower.

2. The ferroelectric memory system of claim 1, further comprising reading control means for supplying a second energy for reading a polarized state of said ferroelectric film,
   wherein said second energy is smaller than said first energy.

3. The ferroelectric memory system of claim 1 or 2,
   wherein said writing control circuit supplies a write signal with a larger pulse width as a temperature is lower.

4. The ferroelectric memory system of claim 3,
   wherein said writing control circuit includes:
      an internal voltage generation circuit for generating an internal voltage signal that has a lower voltage as a temperature is lower; and
      a circuit for receiving said internal voltage signal generated by said internal pulse signal generation circuit and generating a pulse signal having a larger pulse width as the voltage of said internal voltage signal is lower.

5. A ferroelectric memory system comprising:
   a first bit line; a first ferroelectric capacitor which is connected with the first bit line via a first memory cell transistor and between the first bit line and a cell plate line to form a memory cell; and a write circuit for conducting, with a first energy, the operation of writing data in the first ferroelectric capacitor in a desired polarization direction, the ferroelectric memory system characterized in that,
   the write circuit is a circuit designed such that the first energy retains a substantially constant state against temperature change, and
   the write circuit is a circuit that at a first temperature, conducts the write operation at a first voltages and at a second temperature lower than the first temperature, conducts the write operation at a second voltage higher than the first voltage.

6. The ferroelectric memory system of claim 5, further comprising a circuit having an operating mode of conducting, with a first energy, the operation of writing data in the first ferroelectric capacitor in a desired polarization direction and of conducting, with a second energy, the operation of reading polarization data written in the first ferroelectric capacitor, the first energy being greater than the second energy.

7. A ferroelectric memory system comprising:
a first bit line; a first ferroelectric capacitor which is connected with the first bit line via a first memory cell transistor and between the first bit line and a cell plate line to form a memory cell; and a write circuit for conducting, with a first energy, the operation of writing data in the first ferroelectric capacitor in a desired polarization direction, the ferroelectric memory system characterized in that, the write circuit is a circuit designed such that the first energy retains a substantially constant state against temperature change, and the write circuit is a circuit that at a first temperature, conducts the write operation with a first pulse width, and at a second temperature lower than the first temperature, conducts the write operation with a second pulse width larger than the first pulse width.

8. The ferroelectric memory system of claim 7, further comprising a circuit having an operating mode of conducting, with a first energy, the operation of writing data in the first ferroelectric capacitor in a desired polarization direction and of conducting, with a second energy, the operation of reading polarization data written in the first ferroelectric capacitor, the first energy being greater than the second energy.

9. The ferroelectric memory system of claim 8, wherein the write circuit is a circuit made up of an internal voltage generation circuit and a pulse signal generation circuit, in which the internal voltage generation circuit generates a internal voltage signal to generate a low voltage at a low temperature and the pulse signal generation circuit receives the internal voltage signal as a power source and generates a pulse signal.

10. The ferroelectric memory system of claim 7, wherein the write circuit is a circuit made up of an internal voltage generation circuit and a pulse signal generation circuit, in which the internal voltage generation circuit generates an internal voltage signal to generate a low voltage at a low temperature and a pulse signal generation circuit receives the internal voltage signal as a power source and generates a pulse signal.

* * * * *

UNITED STATES PATENT AND TRADEMARK OFFICE
CERTIFICATE OF CORRECTION

PATENT NO.    : 6,449,183 B1
DATED         : September 10, 2002
INVENTOR(S)   : Hiroshige Hirano and Masato Takeo It is certified that error appears in the above-identified patent and that said Letters Patent is hereby corrected as shown below:

<u>Title page,</u>
Item [73], Assignee, delete "Matsushita Electronics Corporation" add -- Matsushita Electric Industrial Co., Ltd. --

Signed and Sealed this

Twenty-third Day of December, 2003

JAMES E. ROGAN
*Director of the United States Patent and Trademark Office*